US011222595B2

(12) United States Patent
Lee et al.

(10) Patent No.: US 11,222,595 B2
(45) Date of Patent: *Jan. 11, 2022

(54) GATE DRIVING CIRCUIT AND DISPLAY DEVICE INCLUDING THE SAME

(71) Applicant: SAMSUNG DISPLAY CO., LTD., Yongin-si (KR)

(72) Inventors: Jaehoon Lee, Seoul (KR); Bonghyun You, Seongnam-si (KR); Soo-yeon Lee, Hwaseong-si (KR); Seokha Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/790,655

(22) Filed: Feb. 13, 2020

(65) Prior Publication Data
US 2020/0184899 A1 Jun. 11, 2020

Related U.S. Application Data

(63) Continuation of application No. 15/335,210, filed on Oct. 26, 2016, now Pat. No. 10,573,244.

(30) Foreign Application Priority Data

Apr. 14, 2016 (KR) ........................ 10-2016-0045766

(51) Int. Cl.
| *G09G 3/3266* | (2016.01) |
| *G09G 3/36* | (2006.01) |
| *G11C 19/28* | (2006.01) |

(52) U.S. Cl.
CPC ......... *G09G 3/3266* (2013.01); *G09G 3/3677* (2013.01); *G11C 19/28* (2013.01); *G09G 2310/0286* (2013.01)

(58) Field of Classification Search
CPC .............. G09G 3/2092; G09G 3/3266; G09G 3/3674–3681; G09G 2300/0809;
(Continued)

(56) References Cited

U.S. PATENT DOCUMENTS

| 8,232,941 B2 | 7/2012 | Yeo et al. |
| 9,177,666 B2 | 11/2015 | Wu |

(Continued)

FOREIGN PATENT DOCUMENTS

| CN | 101202024 A | 6/2008 |
| CN | 102651188 A | 8/2012 |

(Continued)

OTHER PUBLICATIONS

Chinese Intellectual Property Office Action for corresponding Chinese Patent Application No. 201710219946.0, dated Sep. 15, 2020, 10 pages.

(Continued)

*Primary Examiner* — Nathan Danielsen
(74) *Attorney, Agent, or Firm* — Lewis Roca Rothgerber Christie LLP

(57) ABSTRACT

A gate driving circuit includes: a plurality of stages, a k-th stage from among the plurality of stages, the k-th stage including: an input circuit to receive a previous carry signal and to pre-charge a first node; a first output circuit to output a k-th gate signal; a second output circuit to output a k-th carry signal; a discharge hold circuit to transmit a clock signal to a second node, and to discharge the second node with a second low voltage; a first pull down circuit to discharge the k-th gate signal with a first low voltage, and to discharge the first node and the k-th carry signal with the second low voltage; and a discharge circuit for discharging the k-th carry signal with the second low voltage in response to the previous carry signal.

15 Claims, 22 Drawing Sheets

(58) Field of Classification Search
CPC ........ G09G 2310/02–0221; G09G 2310/0248;
G09G 2310/0267; G09G 2310/0278;
G11C 19/28–287
See application file for complete search history.

(56) References Cited

U.S. PATENT DOCUMENTS

| | | |
|---|---|---|
| 2011/0316834 A1 | 12/2011 | Lee et al. |
| 2012/0139883 A1 | 6/2012 | Lee et al. |
| 2013/0038587 A1 | 2/2013 | Song et al. |
| 2013/0088480 A1 | 4/2013 | Hong et al. |
| 2013/0106677 A1* | 5/2013 | Koo .................. G09G 3/36 345/87 |
| 2013/0335392 A1 | 12/2013 | Cho et al. |
| 2016/0210928 A1 | 7/2016 | Cho et al. |

FOREIGN PATENT DOCUMENTS

| | | |
|---|---|---|
| CN | 102779478 A | 11/2012 |
| KR | 10-2012-0060298 A | 6/2012 |
| KR | 10-2012-0073495 A | 7/2012 |
| KR | 10-2013-0016699 A | 2/2013 |
| KR | 10-2013-0142454 A | 12/2013 |
| KR | 10-2015-0019098 A | 2/2015 |
| KR | 10-2015-0088434 A | 8/2015 |
| KR | 10-2015-0094951 A | 8/2015 |
| KR | 10-1543281 B1 | 8/2015 |

OTHER PUBLICATIONS

EPO Extended Search Report dated Oct. 16, 2017, for corresponding European Patent Application No. 17154018.0 (12 pages).

* cited by examiner

GATE DRIVING CIRCUIT AND DISPLAY DEVICE INCLUDING THE SAME

CROSS-REFERENCE TO RELATED APPLICATIONS

This application is a continuation of U.S. patent application Ser. No. 15/335,210, filed Oct. 26, 2016, which claims priority to and the benefit of Korean Patent Application No. 10-2016-0045766, filed Apr. 14, 2016, the entire content of both of which is incorporated herein by reference.

BACKGROUND

1. Field

One or more aspects of example embodiments of the present disclosure relate to a gate driving circuit and a display device including the same.

2. Description of the Related Art

A display device includes a plurality of gate lines, a plurality of data lines, and a plurality of pixels connected to the plurality of gate lines and the plurality of data lines. The display device includes a gate driving circuit for sequentially providing gate signals to the plurality of gate lines, and a data driving circuit for outputting data signals to the plurality of data lines.

The gate driving circuit includes a shift register having a plurality of driving circuits (hereinafter referred to as driving stages). The plurality of driving stages respectively output gate signals corresponding to the plurality of gate lines. Each of the plurality of driving stages includes a plurality of operatively-connected transistors.

The above information disclosed in this Background section is for enhancement of understanding of the background of the inventive concept, and therefore, it may contain information that does not constitute prior art.

SUMMARY

One or more aspects of example embodiments of the present disclosure are directed toward a reliability improved gate driving circuit.

One or more aspects of example embodiments of the present disclosure are directed toward a display device including a reliability improved gate driving circuit.

According to an example embodiment of the inventive concept, a gate driving circuit includes: a plurality of stages configured to provide gate signals to gate lines of a display panel, a k-th stage from among the plurality of stages, where k is a natural number greater than or equal to 2, the k-th stage including: an input circuit configured to receive a previous carry signal from a previous stage and to pre-charge a first node; a first output circuit configured to output a clock signal as a k-th gate signal in response to a signal of the first node; a second output circuit configured to output the clock signal as a k-th carry signal in response to the signal of the first node; a discharge hold circuit configured to transmit the clock signal to a second node in response to the clock signal, and to discharge the second node with a second low voltage in response to the k-th carry signal; a first pull down circuit configured to discharge the k-th gate signal with a first low voltage in response to a signal of the second node and a next carry signal from a next stage, and to discharge the first node and the k-th carry signal with the second low voltage; and a discharge circuit configured to discharge the k-th carry signal with the second low voltage in response to the previous carry signal.

In an embodiment, the discharge circuit may include a first discharge transistor including a first electrode connected to a carry output terminal for outputting the k-th carry signal, a second electrode connected to a second voltage terminal for receiving the second low voltage, and a gate electrode connected to a first input terminal for receiving the previous carry signal of the previous stage.

In an embodiment, the discharge hold circuit may include: a first hold transistor including a first electrode connected to a clock terminal for receiving the clock signal, a second electrode, and a gate electrode connected to the clock terminal; a second hold transistor including a first electrode connected to the clock terminal, a second electrode connected to the second node, and a gate electrode connected to the second electrode of the first hold transistor; a third hold transistor including a first electrode connected to the second electrode of the first hold transistor, a second electrode connected to a second voltage terminal for receiving the second low voltage, and a gate electrode connected to a carry output terminal for outputting the k-th carry signal; and a fourth hold transistor including a first electrode connected to the second node, a second electrode connected to the second voltage terminal, and a gate electrode connected to the carry output terminal.

In an embodiment, the first pull down circuit may include: a first pull down transistor including a first electrode connected to the first node, a second electrode connected to a second voltage terminal for receiving the second low voltage, and a gate electrode connected to a second input terminal for receiving the next carry signal; a second pull down transistor including a first electrode connected to a gate output terminal for outputting the k-th gate signal, a second electrode connected to a first voltage terminal for receiving the first low voltage, and a gate electrode connected to the second node; a third pull down transistor including a first electrode connected to the gate output terminal, a second electrode connected to the first voltage terminal, and a gate electrode connected to the second input terminal; a fourth pull down transistor including a first electrode connected to a carry output terminal for outputting the k-th carry signal, a second electrode connected to the second voltage terminal, and a gate electrode connected to the second node; and a fifth pull down transistor including a first electrode connected to the carry output terminal, a second electrode connected to the second voltage terminal, and a gate electrode connected to the second input terminal.

In an embodiment, the gate driving circuit may further include a second pull down circuit configured to discharge the first node with the second low voltage in response to a signal of the second node.

In an embodiment, the second pull down circuit may include a sixth pull down transistor including a first electrode connected to the first node, a second electrode connected to the second voltage terminal, and a gate electrode connected to the second node.

In an embodiment, the discharge circuit may further include a second discharge transistor including a first electrode connected to the second node, a second electrode connected to the second voltage terminal, and a gate electrode connected to the first input terminal.

According to an example embodiment of the inventive concept, a gate driving circuit includes a plurality of stages, a k-th stage from among the plurality of stages, where k is a natural number greater than or equal to 2, the k-th stage including: an input circuit configured to receive a previous carry signal from a previous stage, and to pre-charge a first node; a first output circuit configured to output a clock signal as a k-th gate signal in response to a signal of the first node; a second output circuit configured to output the clock signal as a k-th carry signal in response to the signal of the first node; a discharge hold circuit configured to transmit the clock signal to a second node in response to the clock signal, and to discharge the second node with a second low voltage in response to the k-th carry signal; a first pull down circuit configured to discharge the k-th gate signal with a first low voltage in response to a signal of the second node and a next carry signal from a next stage, and to discharge the first node and the k-th carry signal with the second low voltage; and a carry feedback circuit configured to feed back the k-th carry signal as the previous carry signal in response to a signal of the first node.

In an embodiment, the gate driving circuit may further include: a first input terminal configured to receive the previous carry signal; a second input terminal configured to receive the next carry signal; a carry output terminal configured to output the k-th carry signal; and a third input terminal configured to receive the k-th carry signal outputted from the carry output terminal.

In an embodiment, the carry feedback circuit may include: a first feedback transistor including a first electrode connected to the third input terminal, a second electrode, and a gate electrode connected to the third input terminal; and a second feedback transistor including a first electrode connected to the second electrode of the first feedback transistor, a second electrode connected to the first input terminal, and a gate electrode connected to the first node.

In an embodiment, the gate driving circuit may further include a discharge circuit configured to discharge the k-th carry signal with the second low voltage in response to the previous carry signal.

In an embodiment, the discharge circuit may include a first electrode connected to the carry output terminal, a second electrode connected to a second voltage terminal for receiving the second low voltage, and a gate electrode connected to the first input terminal.

In an embodiment, the discharge circuit may further include a second discharge transistor including a first electrode connected to the second node, a second electrode connected to the second voltage terminal, and a gate electrode connected to the first input terminal.

According to an example embodiment of the inventive concept, a gate driving circuit includes: a plurality of stages configured to provide gate signals to gate lines of a display panel, a k-th stage from among the plurality of stages, where k is a natural number greater than or equal to 2, the k-th stage including: an input circuit configured to receive a previous carry signal from a previous stage, and to pre-charge a first node; a first output circuit configured to output a clock signal as a k-th gate signal in response to a signal of the first node; a second output circuit configured to output the clock signal as a k-th carry signal in response to the signal of the first node; a discharge hold circuit configured to transmit the clock signal to a second node in response to the clock signal, and to discharge the second node with a second low voltage in response to the k-th carry signal; a first pull down circuit configured to discharge the k-th gate signal with a first low voltage in response to a signal of the second node and a first next carry signal from a first next stage, and to discharge the first node and the k-th carry signal with the second low voltage; a second pull down circuit configured to discharge the first node with the second low voltage in response to a signal of the second node; a third pull down circuit configured to discharge the first node with the second low voltage in response to a second next carry signal from a second next stage; and a discharge circuit configured to discharge the k-th carry signal with the second low voltage in response to the previous carry signal.

In an embodiment, the discharge circuit may include a first discharge transistor including a first electrode connected to a carry output terminal for outputting the k-th carry signal, a second electrode connected to a second voltage terminal for receiving the second low voltage, and a gate electrode connected to a first input terminal for receiving the previous carry signal.

In an embodiment, the first pull down circuit may include: a first pull down transistor including a first electrode connected to the first node, a second electrode, and a gate electrode connected to a second input terminal for receiving the first next carry signal; a second pull down transistor including a first electrode connected to the second electrode of the first pull down transistor, a second electrode connected to a second voltage terminal for receiving the second low voltage, and a gate electrode connected to the second electrode of the first pull down transistor; a third pull down transistor including a first electrode connected to a gate output terminal for outputting the k-th gate signal, a second electrode connected to a first voltage terminal for receiving the first low voltage, and a gate electrode connected to the second node; a fourth pull down transistor including a first electrode connected to the gate output terminal, a second electrode connected to the first voltage terminal, and a gate electrode connected to the second input terminal of the first next stage; a fifth pull down transistor including a first electrode connected to a carry output terminal for outputting the k-th carry signal, a second electrode connected to the second voltage terminal, and a gate electrode connected to the second node; a sixth pull down transistor including a first electrode connected to the carry output terminal, a second electrode connected to the second voltage terminal, and a gate electrode connected to the second input terminal; and a seventh pull down transistor including a first electrode connected to the second node, a second electrode connected to the second voltage terminal, and a gate electrode connected to a first input terminal.

In an embodiment, the first pull down circuit may include: a first pull down transistor including a first electrode connected to the first node, a second electrode connected to a second voltage terminal for receiving the second low voltage, and a gate electrode connected to a second input terminal for receiving the first next carry signal; a second pull down transistor including a first electrode connected to a gate output terminal for outputting the k-th gate signal, a second electrode connected to a first voltage terminal, and a gate electrode connected to a second input terminal for receiving the first next carry signal from the first next stage; and a third pull down transistor including a first electrode connected to a carry output terminal for outputting the k-th carry signal, a second electrode connected to the second voltage terminal, and a gate electrode connected to the second node.

In an embodiment, the second pull down circuit may include a fourth pull down transistor including a first electrode connected to the first node, a second electrode connected to a second voltage terminal for receiving the second low voltage, and a gate electrode connected to the second node, and the third pull down circuit may include a fifth pull down transistor including a first electrode connected to the first node, a second electrode connected to the second voltage terminal for receiving the second low voltage, and a gate electrode connected to a third input terminal for receiving the second next carry signal.

In an embodiment, the previous carry signal from the previous stage may be a (k−1)th carry signal from a (k−1)th stage; the first next carry signal from the first next stage may be a (k+1)th carry signal from a (k+1)th stage; and the second next carry signal from the second next stage may be a (k+2)th carry signal from a (k+2)th stage.

According to an example embodiment of the inventive concept, a display device includes: a display panel including a plurality of pixels respectively connected to a plurality of gate lines and a plurality of data lines; a gate driving circuit including a plurality of stages for outputting gate signals to the plurality of gate lines; and a data driving circuit configured to drive the plurality of data lines, wherein a k-th stage from among the plurality of stages, where k is a natural number greater than or equal to 2, includes: an input circuit configured to receive a previous carry signal from a previous stage, and to pre-charge a first node; a first output circuit configured to output a clock signal as a k-th gate signal in response to a signal of the first node; a second output circuit configured to output the clock signal as a k-th carry signal in response to the signal of the first node; a discharge hold circuit configured to transmit the clock signal to a second node in response to the clock signal, and to discharge the second node with a second low voltage in response to the k-th carry signal; a first pull down circuit configured to discharge the k-th gate signal with a first low voltage in response to a signal of the second node and a next carry signal from a next stage, and to discharge the first node and the k-th carry signal with the second low voltage; and a discharge circuit configured to discharge the k-th carry signal with the second low voltage in response to the previous carry signal.

According to an example embodiment of the inventive concept, a display device includes: a display panel including a plurality of pixels respectively connected to a plurality of gate lines and a plurality of data lines; a gate driving circuit including a plurality of stages for outputting gate signals to the plurality of gate lines; and a data driving circuit configured to drive the plurality of data lines, wherein a k-th stage from among the plurality of stages, where k is a natural number greater than or equal to 2, includes: an input circuit configured to receive a previous carry signal from a previous stage, and to pre-charge a first node; a first output circuit configured to output a clock signal as a k-th gate signal in response to a signal of the first node; a second output circuit configured to output the clock signal as a k-th carry signal in response to the signal of the first node; a discharge hold circuit configured to transmit the clock signal to a second node in response to the clock signal, and to discharge the second node with a second low voltage in response to the k-th carry signal; a first pull down circuit configured to discharge the k-th gate signal with a first low voltage in response to a signal of the second node and a next carry signal from a next stage, and to discharge the first node and the k-th carry signal with the second low voltage; and a carry feedback circuit configured to feed back the k-th carry signal as the previous carry signal in response to the signal of the first node.

BRIEF DESCRIPTION OF THE FIGURES

The accompanying drawings are included to provide a further understanding of the inventive concept, and are incorporated in and constitute a part of this specification.

The drawings illustrate exemplary embodiments of the inventive concept, and together with the description, serve to explain aspects and features of the inventive concept. In the drawings.

DETAILED DESCRIPTION

Figure 1:
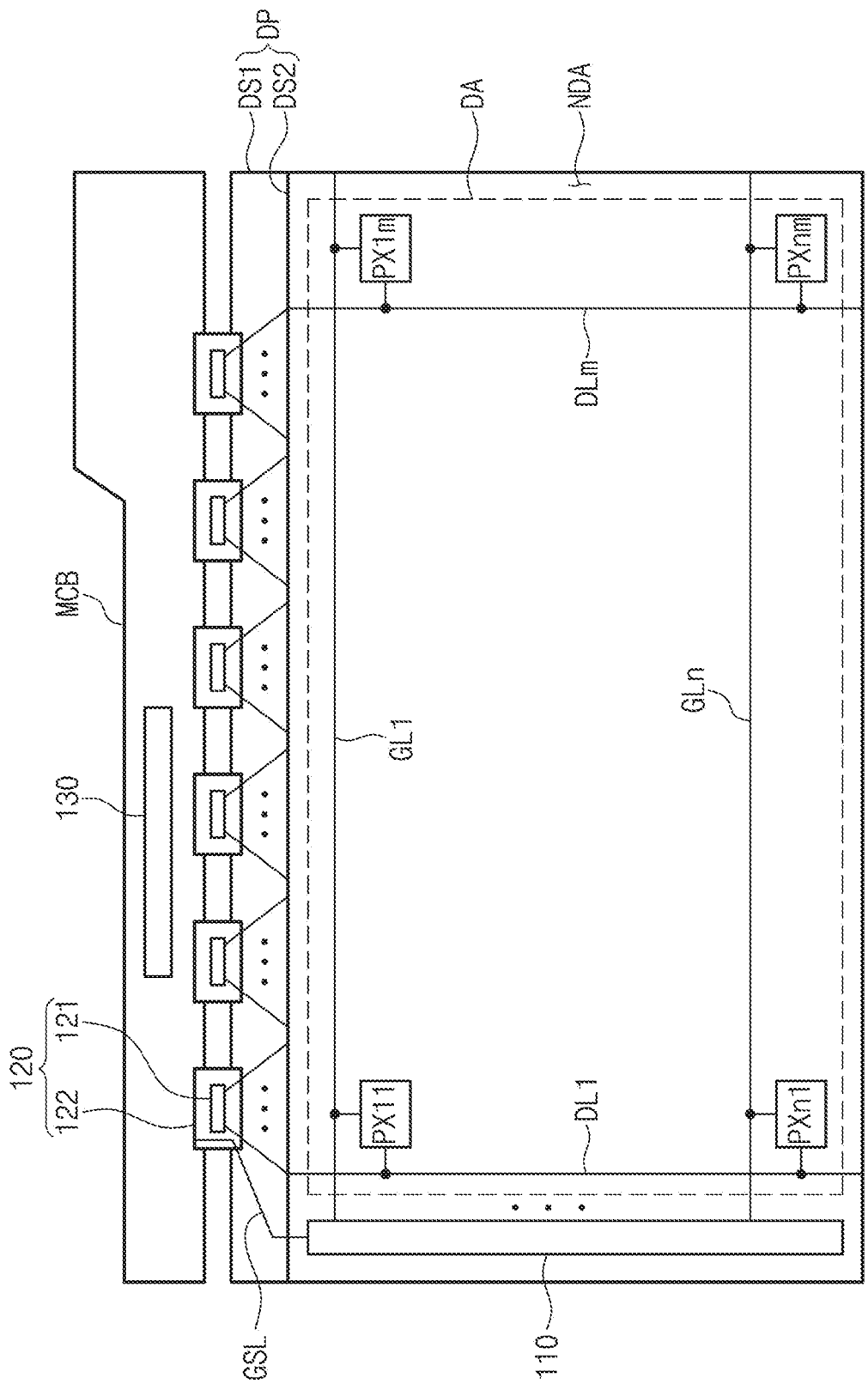
FIG. 1 is a plan view of a display device according to an embodiment of the inventive concept.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the inventive concept described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
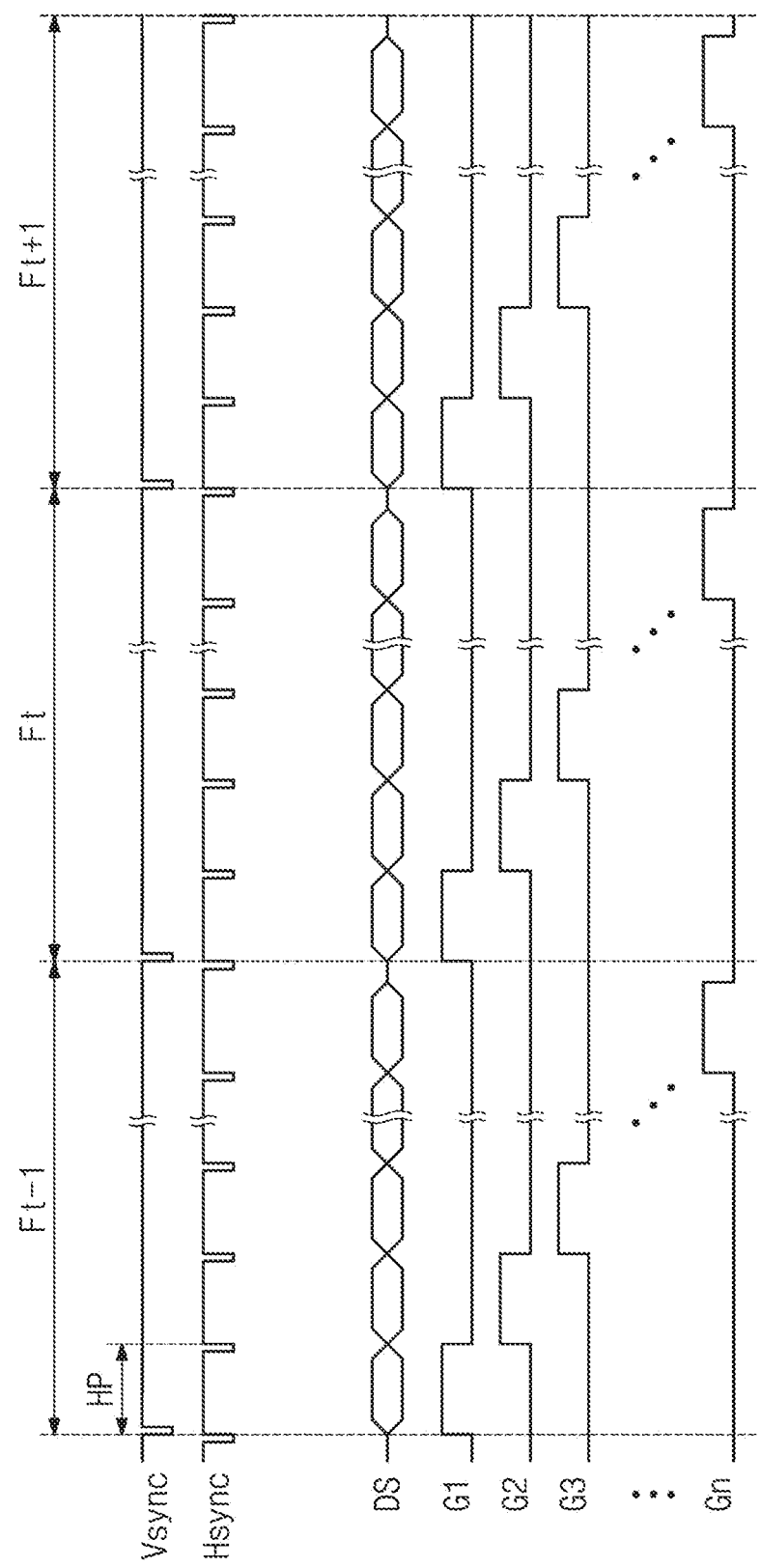
FIG. 2 is a timing diagram illustrating signals of a display device according to an embodiment of the inventive concept.

FIG. 1 is a plan view of a display device according to an embodiment of the inventive concept. FIG. 2 is a timing diagram illustrating signals of a display device according to an embodiment of the inventive concept.

As shown in FIGS. 1 and 2, a display device according to an embodiment of the inventive concept includes a display panel DP, a gate driving circuit 110, a data driving circuit 120, and a driving controller 130.

The display panel DP is not particularly limited, and for example, may include various display panels such as a liquid crystal display panel, an organic light emitting display panel, an electrophoretic display panel, and/or an electrowetting display panel. For convenience, the display panel DP hereinafter is described as a liquid crystal display panel. A liquid crystal display device including the liquid crystal display panel may further include a polarizer and a backlight unit (e.g., a backlight or a backlight source).

The display panel DP includes a first substrate DS1, a second substrate DS2 spaced from the first substrate DS1, and a liquid crystal layer LCL disposed between the first substrate DS1 and the second substrate DS2. On a plane, the display panel DP includes a display area DA where a plurality of pixels PX11 to PXnm are located, and a non-display area NDA surrounding the display area DA.

The display panel DP includes a plurality of gate lines GL1 to GLn disposed on the first substrate DS1, and a plurality of data lines DL1 to DLm crossing the plurality of gate lines GL1 to GLn. The plurality of gate lines GL1 to GLn are connected to the gate driving circuit 110. The plurality of data lines DL1 to DLm are connected to the data driving circuit 120. For convenience, only some of the plurality of gate lines GL1 to GLn and only some of the plurality of data lines DL1 to DLm are illustrated in FIG. 1.

Further, for convenience, only some of the plurality of pixels PX11 to PXnm are illustrated in FIG. 1. The plurality of pixels PX11 to PXnm are respectively connected to corresponding gate lines from among the plurality of gate lines GL1 to GLn and corresponding data lines from among the plurality of data lines DL1 to DLm.

The plurality of pixels PX11 to PXnm may be divided into a plurality of groups according to a color to be displayed. Each of the plurality of pixels PX11 to PXnm may display any one of primary colors. The primary colors may include red, green, blue, and white. However, the inventive concept is not limited thereto, for example, the primary colors may further include (or alternatively include) various colors, such as yellow, cyan, magenta, etc.

Each of the gate driving circuit 110 and the data driving circuit 120 receive a control signal from the driving controller 130. The driving controller 130 may be mounted on a main circuit board MCB. The driving controller 130 receives image data and control signals from an external graphic control unit (e.g., an external graphic controller). The control signals may include vertical sync signals Vsync for distinguishing frame sections Ft−1, Ft, and Ft+1, horizontal sync signals Hsync for distinguishing horizontal sections HP (e.g., row distinction signals), data enable signals (which, for example, may be in high level only during a section where data is outputted to display a data incoming area), and clock signals.

The gate driving circuit 110 generates gate signals G1 to Gn on the basis of a control signal (hereinafter referred to as a gate control signal) received from the driving controller 130 through a signal line GSL, and outputs the gate signals G1 to Gn to the plurality of gate lines GL1 to GLn, during each of the frame sections Ft−1, Ft, and Ft+1. The gate signals G1 to Gn may be sequentially outputted in correspondence to the horizontal sections HP. The gate driving circuit 110 and the pixels PX11 to PXnm may be formed concurrently (e.g., simultaneously) through a thin film process. For example, the gate driving circuit 110 may be mounted as an Oxide Semiconductor TFT Gate driver circuit (OSG) at (e.g., on or in) the non-display area NDA.

FIG. 1 illustrates one gate driving circuit 110 connected to left ends of the plurality of gate lines GL1 to GLn. However the inventive concept is not limited thereto, and according to an embodiment, a display device may include two gate driving circuits. One of the two gate driving circuits may be connected to the left ends of the plurality of gate lines GL1 to GLn and the other one may be connected to right ends of the plurality of gate lines GL1 to GLn. Additionally, one of the two gate driving circuits may be connected to odd gate lines and the other one may be connected to even gate lines.

The data driving circuit 120 generates grayscale voltages (e.g., gray level voltages) according to image data provided from the driving controller 130 on the basis of a control signal (hereinafter referred to as a data control signal) received from the driving controller 130. The data driving circuit 120 outputs the grayscale voltages as data voltages DS to the plurality of data lines DL1 to DLm.

The data voltages DS may include positive data voltages having a positive value with respect to a common voltage and/or negative data voltages having a negative value with respect to the common voltage. For example, some of the data voltages DS applied to the data lines DL1 to DLm may have a positive polarity, and others may have a negative polarity during each of the horizontal sections HP. The polarity of the data voltages DS may be inverted according to the frame sections Ft−1, Ft, and Ft+1 in order to prevent or reduce deterioration of a liquid crystal. The data driving circuit 120 may generate data voltages DS inverted by each frame section unit in response to an invert signal.

The data driving circuit 120 may include a driving chip 121 and a flexible circuit board 122 on which the driving chip 121 is mounted. The data driving circuit 120 may include a plurality of driving chips 121 and a plurality of flexible circuit boards 122. The flexible circuit board 122 electrically connects the main circuit board MCB to the first substrate DS1. The plurality of driving chips 121 provide data signals to corresponding data lines from among the plurality of data lines DL1 to DLm.

FIG. 1 illustrates a Tape Carrier Package (TCP) kind of data driving circuit 120 as an example. According to another embodiment of the inventive concept, the data driving circuit 120 may be disposed on the non-display area NDA of the first substrate DS1 through a Chip on Glass (COG) method.

Figure 3:
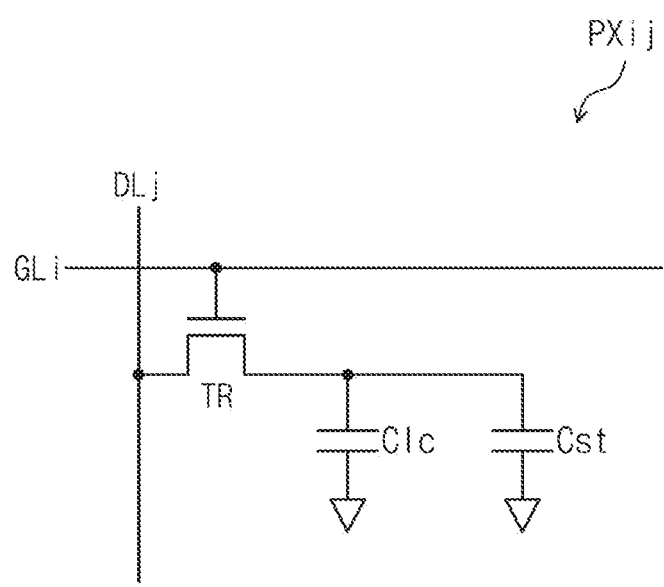
FIG. 3 is an equivalent circuit diagram of a pixel according to an embodiment of the inventive concept.
Figure 4:
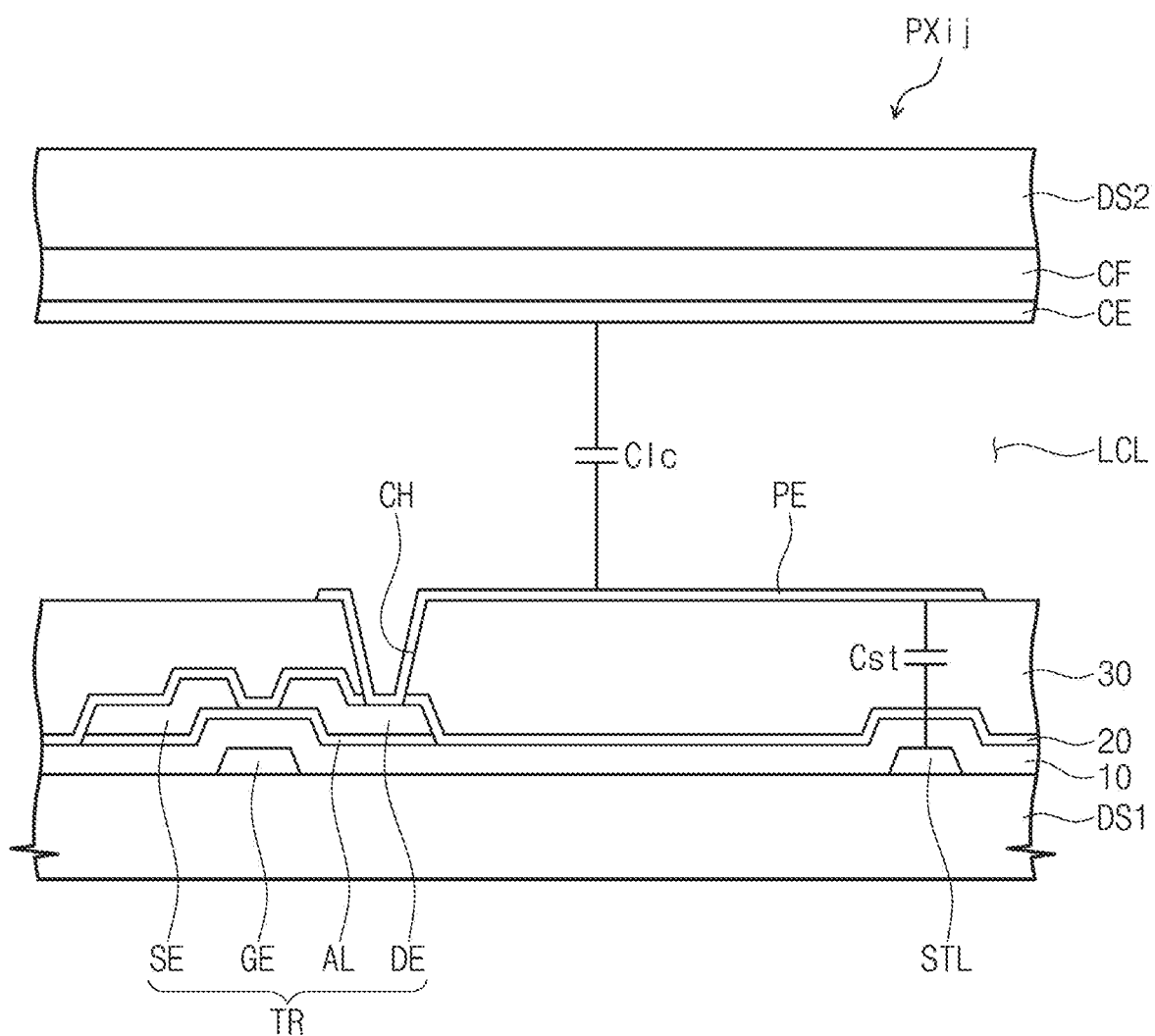
FIG. 4 is a sectional view of a pixel according to an embodiment of the inventive concept.

FIG. 3 is an equivalent circuit diagram of a pixel according to an embodiment of the inventive concept. FIG. 4 is a sectional view of a pixel according to an embodiment of the inventive concept. Each of the plurality of pixels PX11 to PXnm shown in FIG. 1 may have the same or substantially the same circuit structure as that shown in FIG. 3.

As shown in FIG. 3, a pixel PXij includes a pixel thin film transistor (hereinafter referred to as a pixel transistor) TR, a liquid crystal capacitor Clc, and a storage capacitor Cst. Hereinafter, in the specification, a transistor refers to a thin film transistor. According to an embodiment of the inventive concept, the storage capacitor Cst may be omitted.

The pixel transistor TR is electrically connected to an i-th gate line GLi and a j-th data line DLj. The pixel transistor TR outputs a pixel voltage corresponding to a data signal received from the j-th data line DLj in response to a gate signal received from the i-th gate line GLi.

The liquid crystal capacitor Clc is charged with the pixel voltage outputted from the pixel transistor TR. An arrangement of liquid crystal directors included in a liquid crystal layer LCL (see FIG. 4) is changed according to a charge amount charged in the liquid crystal capacitor CLc. The light incident to a liquid crystal layer may be transmitted or blocked according to an arrangement of liquid crystal directors.

The storage capacitor Cst is connected in parallel to the liquid crystal capacitor Clc. The storage capacitor Cst maintains or substantially maintains an arrangement of liquid crystal directors during a set or predetermined section.

As shown in FIG. 4, the pixel transistor TR includes a control electrode GE connected to the i-th gate line GLi (see FIG. 3), an activation part AL overlapping with the control electrode GE, a first electrode SE connected to the j-th data line DLj (see FIG. 3), and a second electrode DE spaced from the first electrode SE.

The liquid crystal capacitor Clc includes a pixel electrode PE and a common electrode CE. The storage capacitor Cst includes the pixel electrode PE and a portion of a storage line STL overlapping with the pixel electrode PE.

The i-th gate line GLi and the storage line STL are disposed on one surface of the first substrate DS1. The control electrode GE is branched from the i-th gate line GLi. The i-th gate line GLi and the storage line STL may include a metal (for example, Al, Ag, Cu, Mo, Cr, Ta, Ti, etc.) or an alloy thereof. The i-th gate line GLi and the storage line STL may have a multi-layer structure, and for example, may include a Ti layer and a Cu layer.

A first insulating layer 10 covering the control electrode GE and the storage line STL is disposed on one surface of the first substrate DS1. The first insulating layer 10 may include at least one selected from an inorganic material and an organic material. The first insulating layer 10 may be an organic layer or an inorganic layer. The first insulating layer 10 may have a multi-layer structure, and for example, may include a silicon nitride layer and/or a silicon oxide layer.

The activation part AL overlapping with the control electrode GE is disposed on the first insulating layer 10. The activation part AL may include a semiconductor layer and an ohmic contact layer. The semiconductor layer is disposed on the first insulating layer 10, and the ohmic contact layer is disposed on the semiconductor layer.

The second electrode DE and the first electrode SE are disposed on the activation part AL. The second electrode DE and the first electrode SE are spaced from each other. Each of the second electrode DE and the first electrode SE partially overlaps with the control electrode GE.

A second insulating layer 20 covering the activation part AL, the second electrode DE, and the first electrode SE is disposed on the first insulating layer 10. The second insulating layer 20 may include at least one selected from an inorganic material and an organic material. The second insulating layer 20 may be an organic layer or an inorganic layer. The second insulating layer 20 may have a multi-layer structure, and for example, may include a silicon nitride layer and/or a silicon oxide layer.

Although the pixel transistor TR having a staggered structure is shown in FIG. 1 exemplarily, a structure of the pixel transistor TR is not limited thereto. For example, in another embodiment, the pixel transistor TR may have a planar structure.

A third insulating layer 30 is disposed on the second insulating layer 20. The third insulating layer 30 provides a flat surface. The third insulating layer 30 may include an organic material.

The pixel electrode PE is disposed on the third insulating layer 30. The pixel electrode PE is connected to the second electrode DE through a contact hole CH penetrating the second insulating layer 20 and the third insulating layer 30. An alignment layer covering the pixel electrode PE may be disposed on the third insulating layer 30.

A color filter layer CF is disposed on one surface of the second substrate DS2. A common electrode CE is disposed on the color filter layer CF. A common voltage is applied to the common electrode CE. The common voltage and the pixel voltage may have different values. An alignment layer covering the common electrode CE may be disposed on the common electrode CE. Another insulating layer may be disposed between the color filter layer CF and the common electrode CE.

The pixel electrode PE and the common electrode CE with the liquid crystal layer LCL therebetween form the liquid crystal capacitor Clc. Additionally, portions of the pixel electrode PE and the storage line STL, which are disposed with the first insulating layer 10, the second insulating layer 20, and the third insulating layer 30 therebetween, form the storage capacitor Cst. The storage line STL receives a storage voltage having a different value than that of the pixel voltage. The storage voltage may have the same value as that of the common voltage.

The pixel PXij shown in FIG. 3 is just one example. Unlike that shown in FIG. 3, at least one of the color filter layer CF and the common electrode CE may be disposed on the first substrate DS1. That is, a liquid display panel according to an embodiment of the inventive concept may include a pixel in a Vertical Alignment (VA) mode, a Patterned Vertical Alignment (PVA) mode, an in-plane switching (IPS) mode, a fringe-field switching (FFS) mode, or a Plane to Line Switching (PLS) mode.

Figure 5:
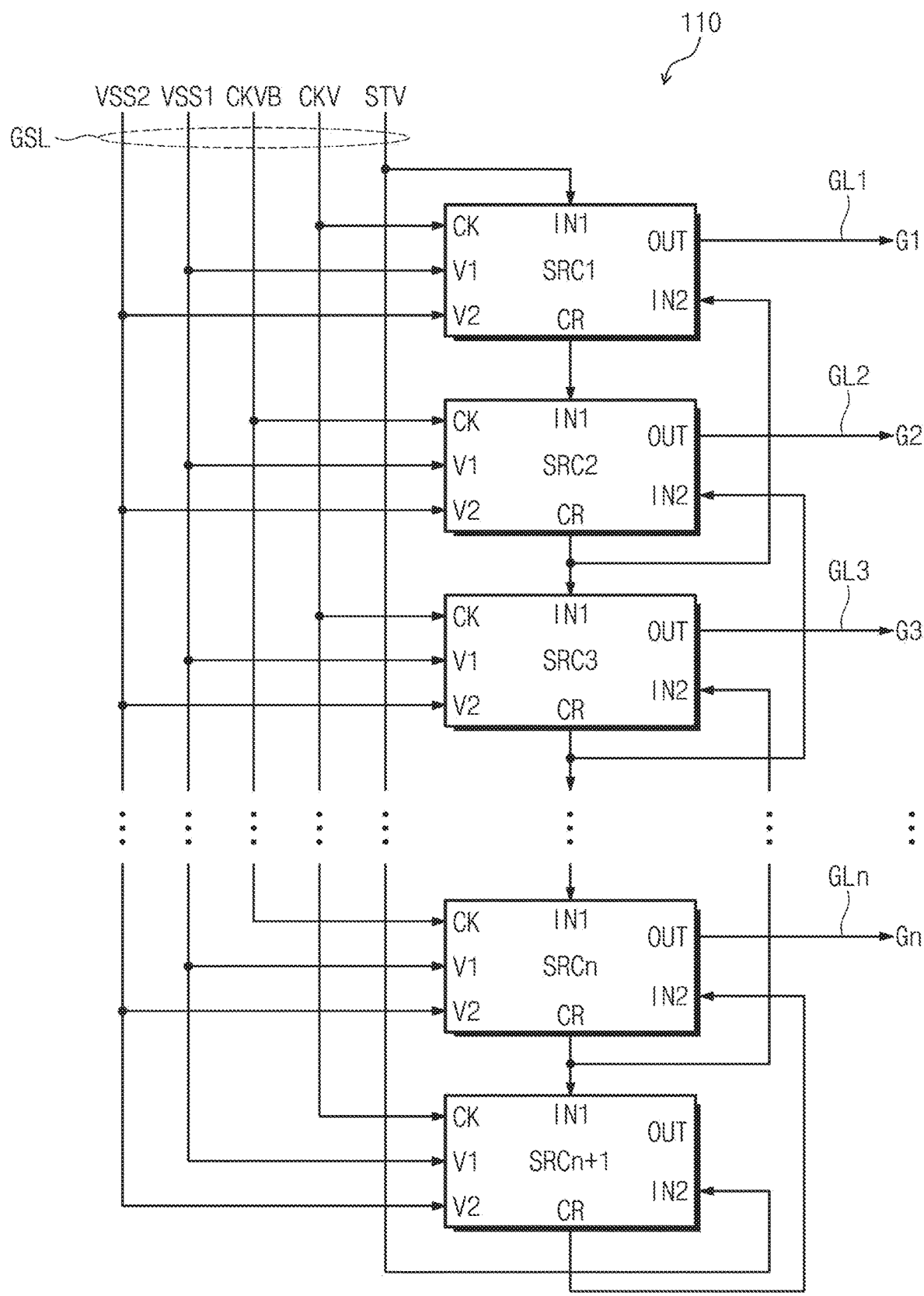
FIG. 5 is a block diagram illustrating a gate driving circuit according to an embodiment of the inventive concept.

FIG. 5 is a block diagram illustrating a gate driving circuit according to an embodiment of the inventive concept.

As shown in FIG. 5, a gate driving circuit 110 includes a plurality of driving stages SRC1 to SRCn, and a dummy driving stage SRCn+1. The plurality of driving stages SRC1 to SRCn and the dummy driving stage SRCn+1 have a cascade relationship, in which they operate in response to a carry signal outputted from a previous stage and a carry signal outputted from the next stage.

Each of the plurality of driving stages SRC1 to SRCn receives a first low voltage VSS1, a second low voltage VSS2, and one of a first clock signal CKV and a second clock signal CKVB, from the driving controller 130 shown in FIG. 1. Each of the first driving stage SRC1 and the dummy driving stage SRCn+1 further receives a start signal STV.

According to an embodiment of the inventive concept, the plurality of driving stages SRC1 to SRCn are respectively connected to the plurality of gate lines GL1 to GLn. The plurality of driving stages SRC1 to SRCn respectively provide gate signals G1 to Gn to the plurality of gate lines GL1 to GLn. According to an embodiment of the inventive concept, gate lines connected to the plurality of driving stages SRC1 to SRCn may be odd gate lines and/or even gate lines from among all the gate lines.

Each of the plurality of driving stages SRC1 to SRCn and the dummy driving stage SRCn+1 includes a first input terminal IN1, a second input terminal IN2, a gate output terminal OUT, a carry output terminal CR, a clock terminal CK, a first voltage terminal (e.g., a first low voltage terminal or a first voltage terminal) V1, and a second voltage terminal (e.g., a second low voltage terminal or a second ground terminal) V2.

The gate output terminal OUT of each of the plurality of driving stages SRC1 to SRCn is connected to a corresponding gate line from among the plurality of gate lines GL1 to GLn. Gate signals G1 to Gn generated from the plurality of driving stages SRC1 to SRCn are provided to the plurality of gate lines GL1 to GLn through the gate output terminals OUT.

The carry output terminal CR of each of the plurality of driving stages SRC1 to SRCn is electrically connected to the first input terminal IN1 of a next driving stage of a corresponding driving stage. Additionally, the carry output terminal CR of each of the plurality of driving stages SRC2 to SRCn, except for the first driving stage SRC1, is electrically connected to the second input terminal IN2 of a previous driving stage of a corresponding driving stage. For example, the carry output terminal CR of a k-th driving stage SRCk from among the driving stages SRC1 to SRCn is connected to each of the first input terminal IN1 of a next driving stage (k+1)th driving stage SRCk+1 and the second input terminal IN2 of a previous driving stage (k−1)th driving stage SRCk−1. The carry output terminal CR of each of the plurality of driving stages SRC1 to SRCn and the dummy driving stage SRCn+1 outputs a carry signal.

The first input terminal IN1 of each of the plurality of driving stages SRC2 to SRCn and the dummy driving stage SRCn+1 receives a carry signal of a previous driving stage of a corresponding driving stage. For example, the first input terminal IN1 of the k-th driving stage SRCk receives the carry signal CRk−1 of the previous driving stage (k−1)th driving stage SRCk−1. The first input terminal IN1 of the first driving stage SRC1 from among the plurality of driving stages SRC1 to SRCn receives a vertical start signal STV from the driving controller 130 shown in FIG. 1, instead of the carry signal of a previous driving stage.

The second input terminal IN2 of each of the plurality of driving stages SRC1 to SRCn receives a carry signal from the carry output terminal CR of the next driving stage of a corresponding driving stage. For example, the second input terminal IN2 of the k-th driving stage SRCk receives a carry signal CRk+1 outputted from the carry output terminal CR of the (k+1)th driving stage SRCk+1. According to another embodiment of the inventive concept, the second input terminal IN2 of each of the plurality of driving stages SRC1 to SRCn may be electrically connected to the gate output terminal OUT of the next driving stage of a corresponding driving stage. The second input terminal IN2 of the nth driving stage SRCn receives a carry signal CRn+1 outputted from the carry output terminal CR of the dummy driving stage SRCn+1.

The clock terminal CK of each of the plurality of driving stages SRC1 to SRCn receives one of the first clock signal CKV and the second clock signal CKVB. Each of the clock terminals CK of odd driving stages (e.g., SRC1, SRC3, SRCn−1) from among the plurality of driving stages SRC1 to SRCn may receive the first clock signal CKV. Each of the clock terminals CK of even driving stages (e.g., SRC2, SRC4, . . . , SRCn) from among the plurality of driving stages SRC1 to SRCn may receive the second clock signal CKVB. The first clock signal CKV and the second clock signal CKVB may have different phases from each other.

The first voltage terminal V1 of each of the plurality of driving stages SRC1 to SRCn receives a first low voltage (e.g., a first ground voltage) VSS1. The second voltage terminal V2 of each of the plurality of driving stages SRC1 to SRCn receives a second low voltage (e.g., a second ground voltage) VSS2. The first low voltage VSS1 and the second low voltage VSS2 have different voltage levels from each other, and the second low voltage VSS2 has a lower voltage level than that of the first low voltage VSS1.

According to an embodiment of the inventive concept, each of the plurality of driving stages SRC1 to SRCn may omit one of the first input terminal IN1, the second input terminal IN2, the gate output terminal OUT, the carry output terminal CR, the clock terminal CK, the first voltage terminal V1, and the second voltage terminal V2, and/or may further include other suitable terminals, depending on a circuit configuration. For example, one of the first voltage terminal V1 and the second voltage terminal V2 may be omitted. In this case, each of the plurality of driving stages SRC1 to SRCn receives only one of the first low voltage VSS1 and the second low voltage VSS2. Additionally, the connection relationship of the plurality of driving stages SRC1 to SRCn may be variously changed.

Figure 6:
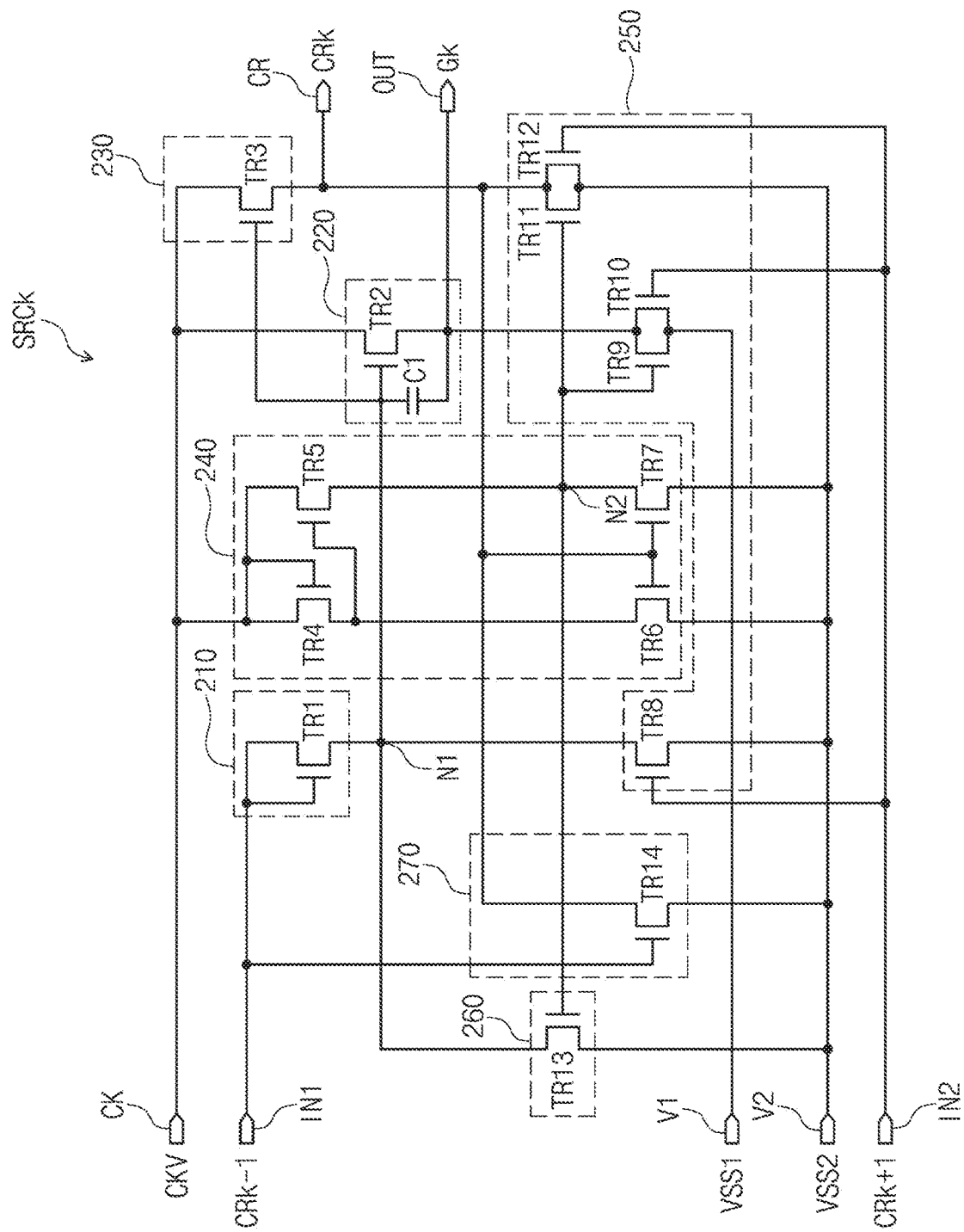
FIG. 6 is a circuit diagram of a driving stage according to an embodiment of the inventive concept.

FIG. 6 is a circuit diagram of a driving stage according to an embodiment of the inventive concept.

FIG. 6 illustrates the k-th driving stage SRCk, where k is a natural number greater than or equal to 2, from among the plurality of driving stages SRC1 to SRCn shown in FIG. 5. Each of the plurality of driving stages SRC1 to SRCn shown in FIG. 5 may have the same or substantially the same circuit structure as that of the k-th driving stage SRCk. The driving stage SRCk shown in FIG. 6 may receive a first clock signal CKV, but is not limited thereto and may receive a second clock signal CKVB instead of the first clock signal CKV.

Referring to FIG. 6, the k-th driving stage SRCk includes an input circuit 210, a first output circuit 220, a second output circuit 230, a discharge hold circuit 240, a first pull down circuit 250, and a discharge circuit 270. The k-th driving stage SRCk may further include a second pull down circuit 260.

The input circuit 210 receives a (k−1)th carry signal CRk−1 from a (k−1)th stage SRCk−1, and pre-charges a first node N1. The first output circuit 220 outputs a clock signal CKV as the k-th carry signal Gk in response to a signal of the first node N1. The second output circuit 230 outputs a clock signal CKV as the k-th carry signal CRk in response to the signal of the first node N1.

The discharge hold circuit 240 transmits the first clock signal CKV to a second node N2 in response to the first clock signal CKV, and discharges the second node N2 with the second low voltage VSS2 in response to the k-th carry signal CRk.

The first pull down circuit 250 discharges the k-th gate signal Gk with the first low voltage VSS1, and discharges the first node N1 and the k-th carry signal CRk with the second low voltage VSS2, in response to a signal of the second node N2 and the (k+1)th carry signal CRk+1 from the (k+1)th stage SRCk+1. The second pull down circuit 260 discharges the first node N1 with the second low voltage VSS2 in response to a signal of the second node N2. The discharge circuit 270 discharges the k-th carry signal CRk with the second low voltage VSS2 in response to the (k−1)th carry signal CRk−1.

An example configuration of the input circuit 210, the first output circuit 220, the second output circuit 230, the discharge hold circuit 240, the first pull down circuit 250, the second pull down circuit 260, and the discharge circuit 270 is described in more detail below.

The input circuit 210 includes an input transistor TR1. The input transistor TR1 includes a first electrode connected to a first input terminal IN1 for receiving the (k−1)th carry signal CRk−1 from the (k−1)th stage SRCk−1, a second electrode connected to a first node N1, and a gate electrode connected to the first input terminal IN1.

The first output circuit 220 includes a first output transistor TR2 and a capacitor C1. The first output transistor TR2 includes a first electrode connected to a clock terminal CK for receiving a first clock signal CKV, a second electrode connected to a gate output terminal OUT for outputting the k-th gate signal Gk, and a gate electrode connected to the first node N1. The capacitor C1 is connected between the first node N1 and the gate output terminal OUT.

The second output circuit 230 includes a second output transistor TR3. The second output transistor TR3 includes a first electrode connected to the clock terminal CK, a second electrode connected to a carry output terminal CR for outputting the k-th carry signal CRk, and a gate electrode connected to the first node N1.

The discharge hold circuit 240 includes first to fourth hold transistors TR4, TR5, TR6, and TR7. The first hold transistor TR4 includes a first electrode connected to the clock terminal CK, a second electrode, and a gate electrode connected to the clock terminal CK. The second hold transistor TR5 includes a first electrode connected to the clock terminal CK, a second electrode connected to the second node N2, and a gate electrode connected to the second electrode of the first hold transistor TR4. The third hold transistor TR6 includes a first electrode connected to the second electrode of the first hold transistor TR4, a second electrode connected to the second voltage terminal V2 for receiving the second low voltage VSS2, and a gate electrode connected to the carry output terminal CR for outputting the k-th carry signal CRk. The fourth hold transistor TR7 includes a first electrode connected to the second node N2, a second electrode connected to the second voltage terminal V2, and a gate electrode connected to the carry output terminal CR.

The first pull down circuit 250 includes first to fifth pull down transistors TR8, TR9, TR10, TR11, and TR12. The first pull down transistor TR8 includes a first electrode connected to the first node N1, a second electrode connected to the second voltage terminal V2, and a gate electrode connected to the second input terminal IN2. The second pull down transistor TR9 includes a first electrode connected to the gate output terminal OUT, a second electrode connected to the first voltage terminal V1 for receiving the first low voltage VSS1, and a gate electrode connected to the second node N2. The third pull-down transistor TR10 includes a first electrode connected to the gate output terminal OUT, a second electrode connected to the first voltage terminal V1, and a gate electrode connected to the second input terminal IN2 for receiving the (k+1)th carry signal CRk+1 from the (k+1)th stage SRCk+1. The fourth pull down transistor TR11 includes a first electrode connected to the carry output terminal CR, a second electrode connected to the second voltage terminal V2, and a gate electrode connected to the second node N2. The fifth pull down transistor TR12 includes a first electrode connected to the carry output terminal CR, a second electrode connected to the second voltage terminal V2, and a gate electrode connected to the second input terminal IN2.

The second pull-down circuit 260 includes a sixth pull-down transistor TRG13. The sixth pull down transistor TR13 includes a first electrode connected to the first node N1, a second electrode connected to the second voltage terminal V2, and a gate electrode connected to the second node N2.

The discharge circuit 270 includes a first discharge transistor TR14. The first discharge transistor TR14 includes a first electrode connected to the carry output terminal CR, a second electrode connected to the second voltage terminal V2, and a gate electrode connected to the first input terminal IN1.

Figure 7:
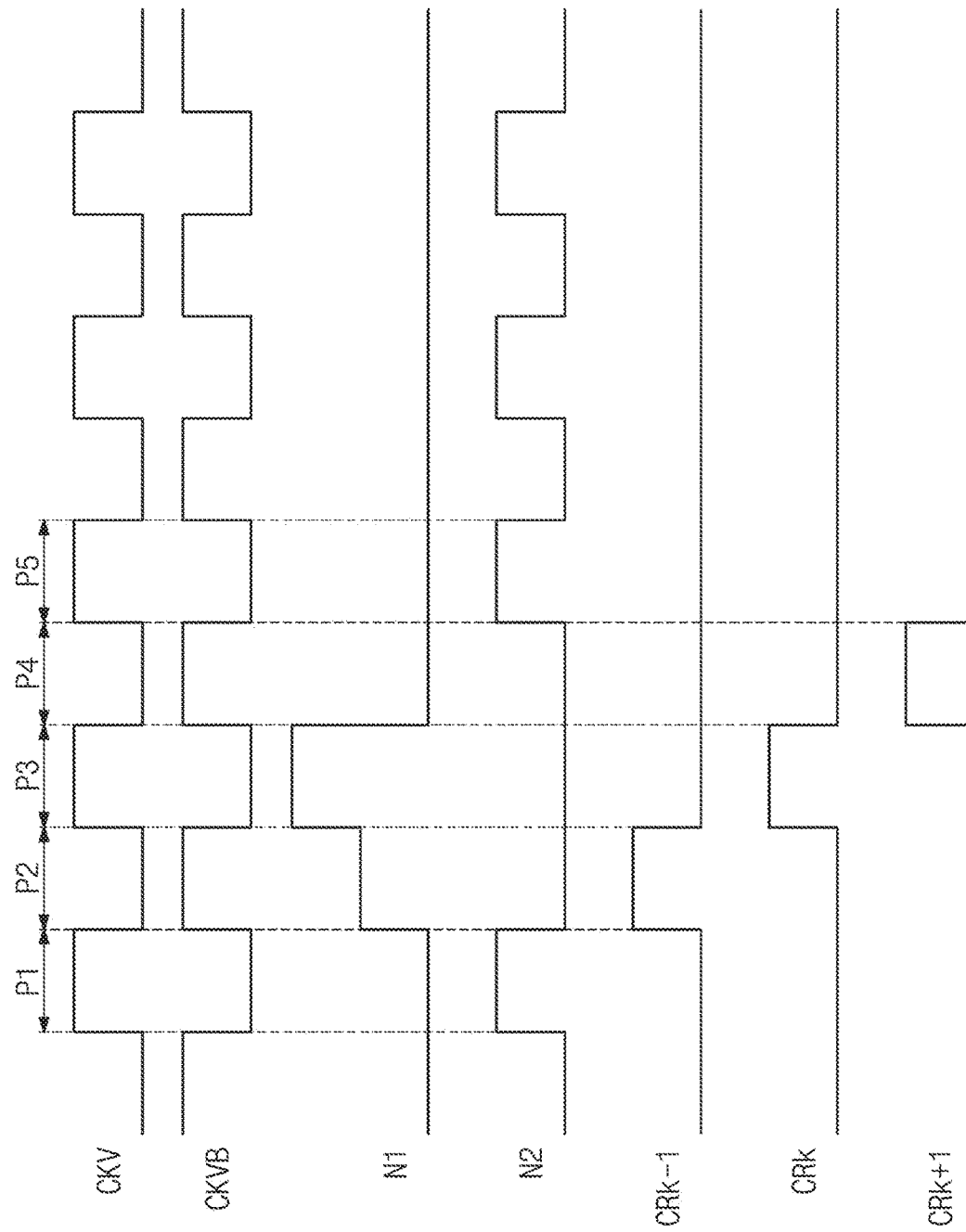
FIG. 7 is a timing diagram illustrating an operation of a driving stage shown in FIG. 6.

FIG. 7 is a timing diagram illustrating an operation of a driving stage shown in FIG. 6.

Referring to FIGS. 6 and 7, the first clock signal CKV shifts to a high level during a first section P1 (in time). During a second section P2 (in time), the first clock signal CKV shifts to a low level, and the (k−1)th carry signal CRk−1 shifts to a high level. When the input transistor TR1 is turned on in response to the high-level of the (k−1)th carry signal CRk−1, the first node N1 is pre-charged to a set or predetermined voltage level (for example, a voltage level corresponding to the (k−1)th carry signal CRk−1).

If the first clock signal CKV shifts to a high level during a third section P3 (in time), as the first output transistor TR2 is turned on, a signal level of the first node N1 is boosted-up by the first capacitor C1, and the k-th gate signal Gk outputted to the gate output terminal OUT shifts to a high level. Moreover, if the first clock signal CKV shifts to a high level, as the second output transistor TR3 is turned on, the k-th carry signal CRk outputted to the carry output terminal CR shifts to a high level. At this point, as the third hold transistor TR6 and the fourth hold transistor TR7 are turned on by the high-level k-th carry signal CRk, the second node N2 maintains or substantially maintains (or holds) a level of the second low voltage VSS2.

During a fourth section P4 (in time), when the first clock signal CKV shifts to a low level, each of the first output transistor TR2 and the second output transistor TR3 is turned off. Then, if the (k+1)th carry signal CRk+1 from the (k+1)th stage SRCk+1 shifts to a high level, the first pull down transistor TR8, the third pull down transistor TR10, and the fifth pull down transistor TR12 are turned on, the first node N1 and the k-th carry signal CRk are discharged with the second low voltage VSS2, and the k-th gate signal Gk is discharged with the first low voltage VSS1.

During a fifth section P5 (in time), if the first clock signal CKV shifts to a high level, since the first hold transistor TR4 and the second hold transistor TR5 in the discharge hold circuit 240 are turned on, the high-level first clock signal CKV is transmitted to the second node N2. Since the second pull down transistor TR9 and the fourth pull down transistor TR11 are turned on while the second node N2 is in a high level, the k-th gate signal Gk may be maintained or substantially maintained with the first low voltage VSS1, and the k-th carry signal CRk may be maintained or substantially maintained with the second low voltage VSS2.

After the k-th gate signal Gk and the k-th carry signal CRk shift from a high level to a low level during the frame section Ft shown in FIG. 2, until the k-th gate signal Gk and the k-th carry signal CRk shift to a high level again during the next frame section Ft+1, as the fourth section P4 and the fifth section P5 shown in FIG. 7 are repeated, the k-th gate signal Gk and the k-th carry signal CRk may maintain or substantially maintain a low level.

Figure 8:
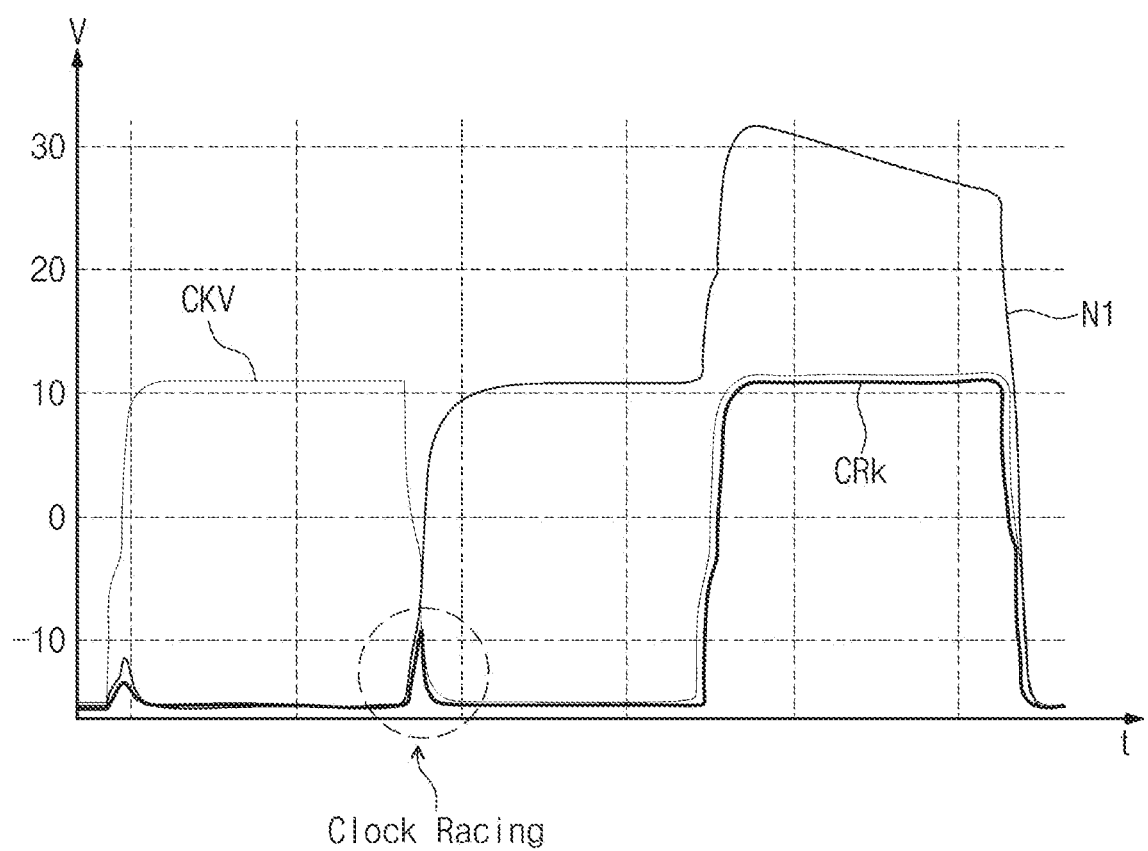
FIG. 8 is a view illustrating a signal change according to an operation of a driving stage shown in FIG. 6.

FIG. 8 is a view illustrating a signal change according to an operation of a driving stage shown in FIG. 6.

Referring to FIGS. 6, 7, and 8, during the first section P1, the high-level first clock signal CKV is provided to the first electrode of each of the first output transistor TR2 and the second output transistor TR3.

When the first section P1 changes to the second section P2, the first clock signal CKV shifts from a high level to a low level, and the (k−1)th carry signal CRk−1 shifts from a low level to a high level. In the case that the discharge of the first clock signal CKV is delayed when the first node N1 is pre-charged in response to the (k−1)th carry signal CRk−1, a clock racing effect that the first output transistor TR2 and the second output transistor TR3 are turned on temporarily may occur during the second section P2. Such a clock racing effect may be further intensified in a stage far from the driving controller 130 shown in FIG. 1. For example, when the threshold voltage of the input transistor TR1, the first output transistor TR2, and the second output transistor TR3 is shifted negatively, noise due to a clock racing effect may be increased.

The discharge transistor TR14 in the discharge circuit 270 shown in FIG. 6 is turned on during the second section P2, that is, while the (k−1)th carry signal CRk−1 is in a high level, and discharges the k-th carry signal CRk with the second low voltage VSS2.

Figure 9:
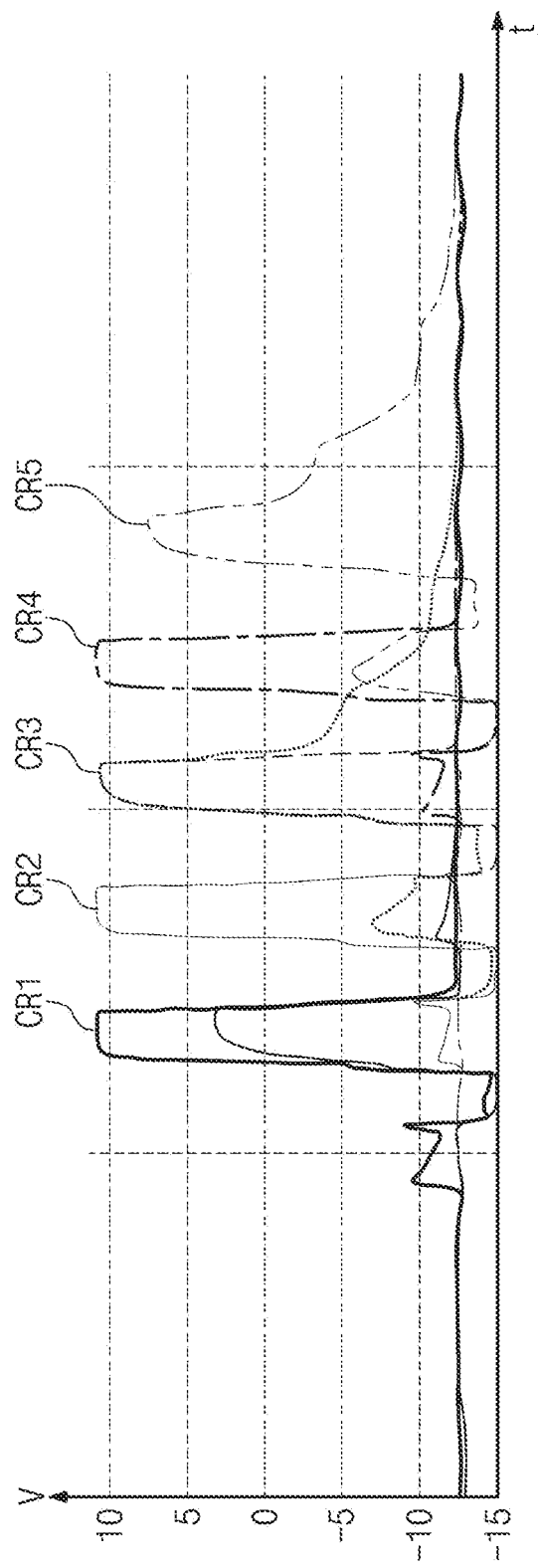
FIG. 9 is a view illustrating carry signals outputted from driving stages shown in FIG. 5 when a discharge transistor in a driving stage shown in FIG. 6 does not operate.

FIG. 9 is a view illustrating carry signals outputted from driving stages shown in FIG. 5 when a discharge transistor in a driving stage shown in FIG. 6 does not operate.

Figure 10:
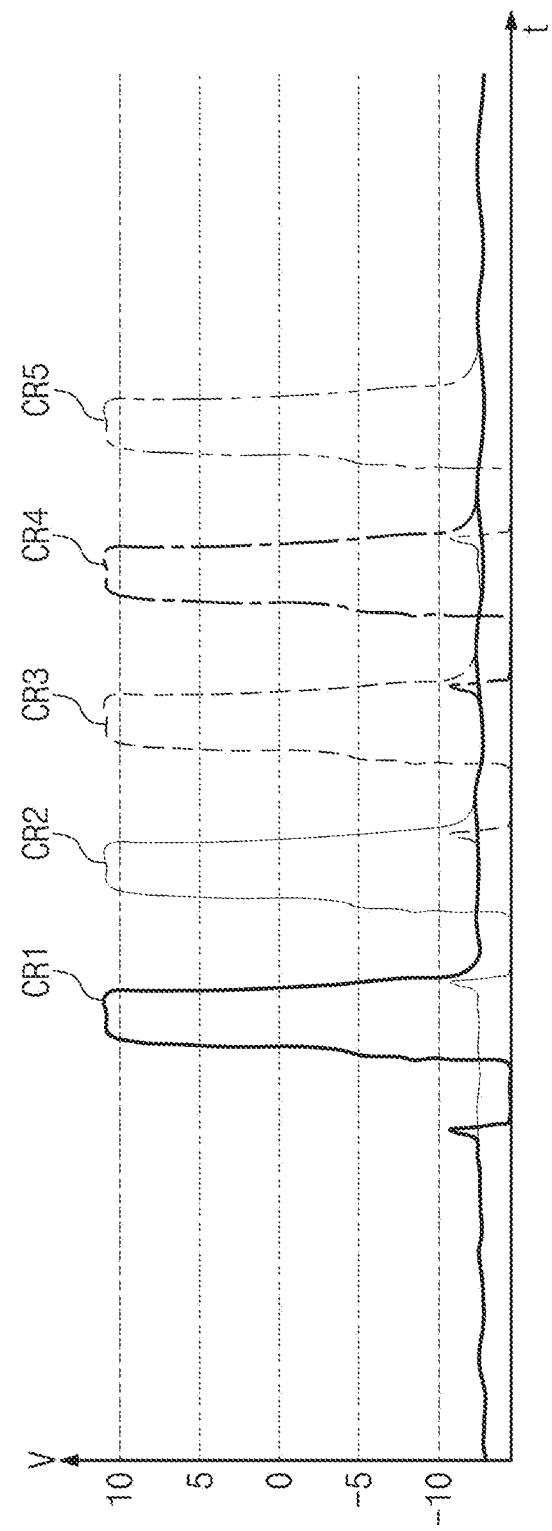
FIG. 10 is a view illustrating carry signals outputted from driving stages shown in FIG. 5 when a discharge transistor in a driving stage shown in FIG. 6 operates.

FIG. 10 is a view illustrating carry signals outputted from driving stages shown in FIG. 5 when a discharge transistor in a driving stage shown in FIG. 6 operates.

Referring to FIGS. 6, 8, and 9, when the discharge transistor TR14 in the discharge circuit 270 does not operate, a clock racing effect of the carry signal CR5 outputted from the stage SRC5 that is farther away from the driving controller 130 shown in FIG. 1 becomes further intensified in comparison to the carry signal CR1 outputted from the first stage SRC1.

Referring to FIGS. 6 and 10, as the discharge transistor TR14 in the discharge circuit 270 is turned on, and the k-th carry signal CRk is discharged with the second low voltage VSS2 while the (k−1)th carry signal CRk−1 is in a high level, the carry signals CR1 to CR5 are each outputted in a stable state.

Figure 11:
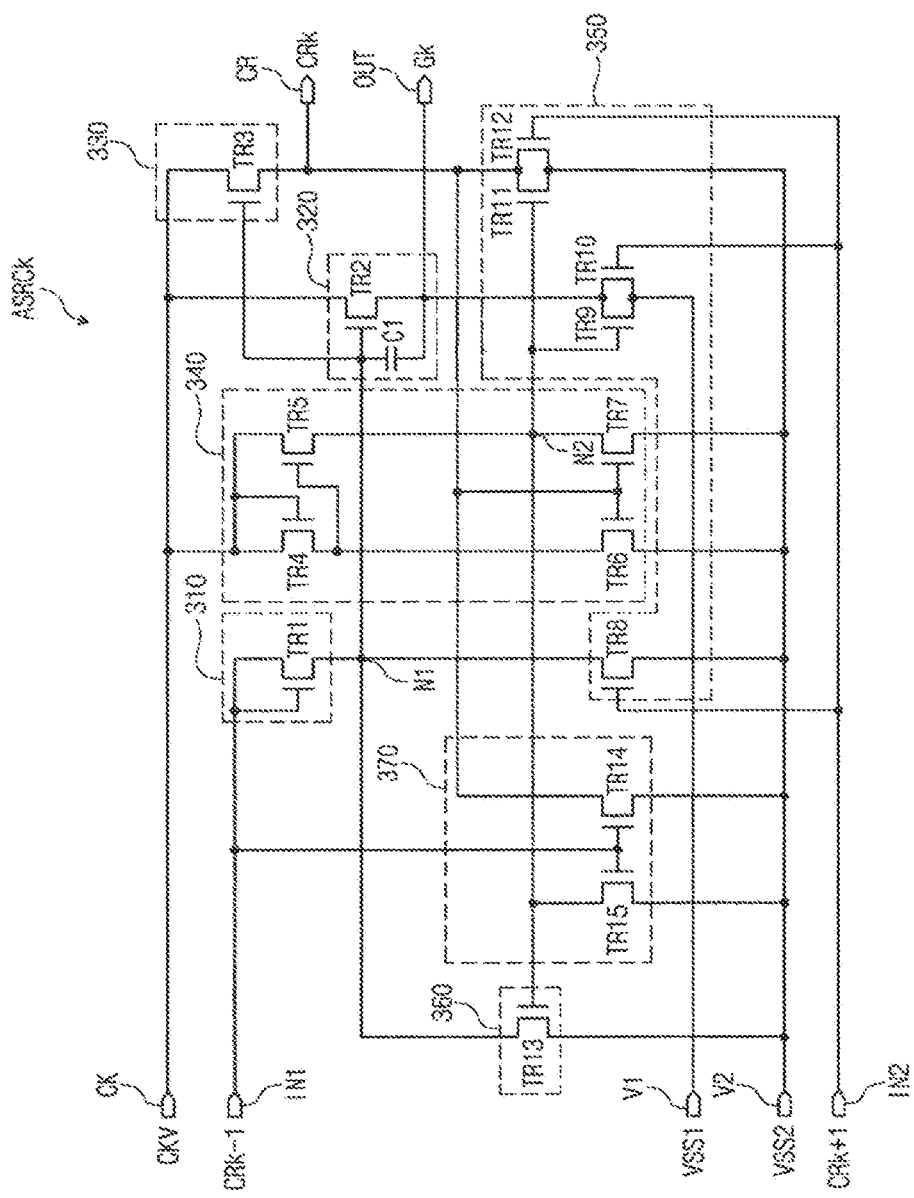
FIG. 11 is a circuit diagram of a driving stage according to another embodiment of the inventive concept.

FIG. 11 is a circuit diagram of a driving stage according to another embodiment of the inventive concept.

FIG. 11 is a view illustrating a k-th driving stage ASRCk, where k is a natural number greater than or equal to 2, from among the plurality of driving stages SRC1 to SRCn shown in FIG. 5. Each of the plurality of driving stages SRC1 to SRCn shown in FIG. 5 may have the same or substantially the same circuit structure as that of the k-th driving stage ASRCk shown in FIG. 9. The k-th driving stage ASRCk shown in FIG. 11 may receive a first clock signal CKV, but is not limited thereto and may receive a second clock signal CKVB instead of the first clock signal CKV.

Referring to FIG. 11, the k-th driving stage ASRCk includes an input circuit 310, a first output circuit 320, a second output circuit 330, a discharge hold circuit 340, a first pull down circuit 350, and a discharge circuit 370. The k-th driving stage ASRCk may further include a second pull down circuit 360.

Because the transistors TR1 to TR14 in the k-th driving stage ASRCk shown in FIG. 11 have the same or substantially the same configuration as those of the transistors TR1 to TR14 in the k-th driving stage SRCk shown in FIG. 6, the same reference numerals are used, and overlapping description is omitted.

The discharge circuit 370 shown in FIG. 11 includes a first discharge transistor TR14 and a second discharge transistor TR15. The first discharge transistor TR14 includes a first electrode connected to the carry output terminal CR, a second electrode connected to the second voltage terminal V2, and a gate electrode connected to the first input terminal IN1. The second discharge transistor TR15 includes a first electrode connected to the second node N2, a second electrode connected to the second voltage terminal V2, and a gate electrode connected to the first input terminal IN1.

Due to long time driving or high temperature environment, the threshold voltage of the sixth pull down transistor TR13 in the second pull down circuit 360 may be shifted negatively. When the threshold voltage of the sixth pull down transistor TR13 is shifted negatively, and a falling time of the first clock signal CKV is delayed, as the sixth pull down transistor TR13 is turned on, a voltage level of the first node N1 may be discharged with the second low voltage VSS2.

As the second discharge transistor TR15 is turned on when a high-level (k−1)th carry signal CRk−1 is received through the first input terminal IN1, the second discharge transistor TR15 discharges the second node N2 with the second low voltage VSS2. Therefore, during only the second section P2 shown in FIG. 7, the sixth pull down transistor TR13 may maintain or substantially maintain a turn off state.

Figure 12:
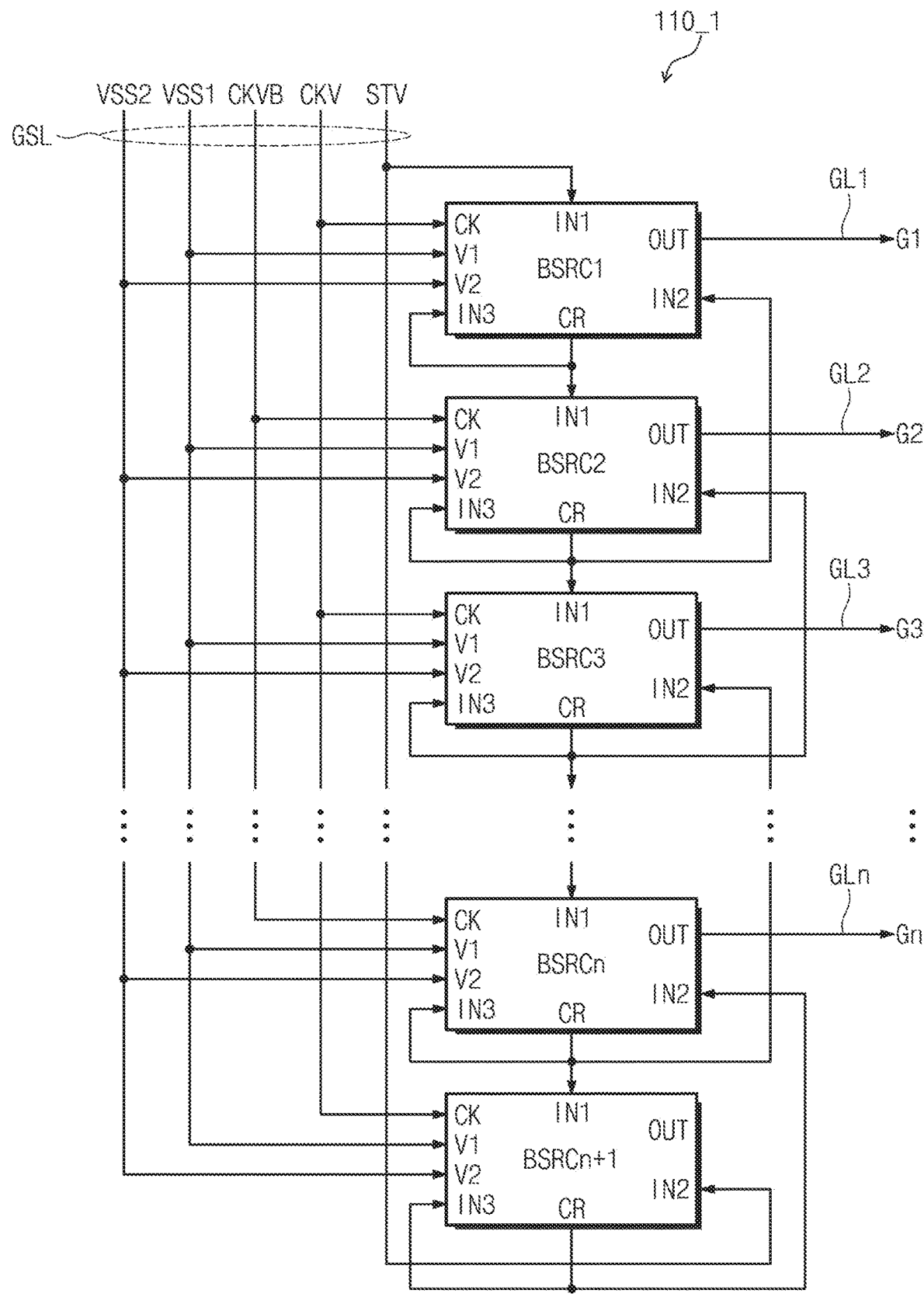
FIG. 12 is a block diagram illustrating a gate driving circuit according to another embodiment of the inventive concept.

FIG. 12 is a block diagram illustrating a gate driving circuit according to another embodiment of the inventive concept.

Referring to FIG. 12, a gate driving circuit 110_1 includes a plurality of driving stages BSRC1 to BSRCn and a dummy driving stage BSRCn+1. The plurality of driving stages BSRC1 to BSRCn and the dummy driving stage BSRCn+1 have a cascade relationship, in which they operate in response to a carry signal outputted from a previous stage and a carry signal outputted from a next stage.

Each of the plurality of driving stages BSRC1 to BSRCn receives a first low voltage (e.g., a first ground voltage) VSS1, a second low voltage (e.g., a second ground voltage) VSS2, and one of a first clock signal CKV and a second clock signal CKVB, from the driving controller 130 shown in FIG. 1. Each of the first driving stage BSRC1 and the dummy driving stage BSRCn+1 further receives a start signal STV.

According to an embodiment of the inventive concept, the plurality of driving stages BSRC1 to BSRCn are respectively connected to the plurality of gate lines GL1 to GLn. The plurality of driving stages BSRC1 to BSRCn provide gate signals G1 to Gn to the plurality of gate lines GL1 to GLn, respectively. According to an embodiment of the inventive concept, gate lines GL1 to GLn connected to the plurality of driving stages BSRC1 to BSRCn may be odd gate lines and/or even gate lines from among all of the gate lines.

Each of the plurality of driving stages BSRC1 to BSRCn and the dummy driving stage BSRCn+1 includes a first input terminal IN1, a second input terminal IN2, a third input terminal IN3, a gate output terminal OUT, a carry output terminal CR, a clock terminal CK, a first voltage terminal V1, and a second voltage terminal V2.

The carry output terminal CR of each of the plurality of driving stages BSRC1 to BSRCn is electrically connected to the first input terminal IN1 of the next driving stage of a corresponding driving stage. Additionally, the carry output terminal CR of each of the plurality of driving stages BSRC2 to BSRCn is electrically connected to the second input terminal IN2 of a previous driving stage and to its own third input terminal IN3. For example, the carry output terminal CR of a k-th driving stage BSRCk among the driving stages BSRC1 to BSRCn is connected to the second input terminal IN2 of a (k−1)th driving stage BSRCk−1, the first input terminal N1 of a (k+1)th driving stage BSRCk+1, and the third input terminal IN3 of the k-th driving stage BSRCk. The carry output terminal CR of each of the plurality of driving stages BSRC1 to BSRCn and the dummy driving stage BSRCn+1 outputs a carry signal.

Because the first input terminal IN1, the second input terminal IN2, the first voltage terminal V1, the second voltage terminal V2, and the gate output terminal OUT in each of the plurality of driving stages BSRC1 to BSRCn shown in FIG. 12 have the same or substantially the same configurations as those of the first input terminal IN1, the second input terminal IN2, the first voltage terminal V1, the second ground germinal V2, and the gate output terminal OUT of each of the plurality of driving stages SRC1 to SRCn shown in FIG. 5, overlapping descriptions are omitted.

Figure 13:
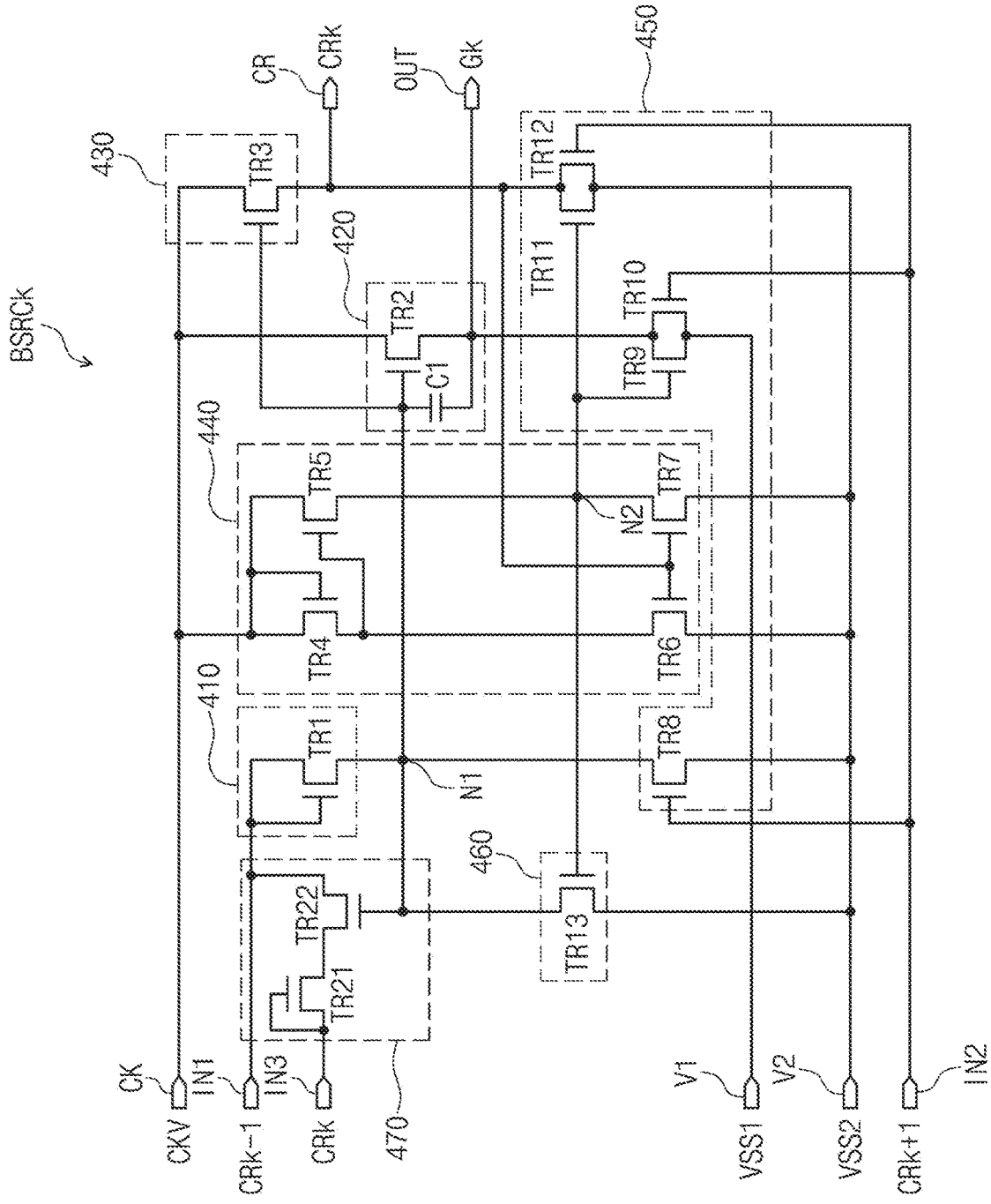
FIG. 13 is a circuit diagram illustrating a driving stage according to an embodiment of the inventive concept.

FIG. 13 is a circuit diagram illustrating a driving stage according to an embodiment of the inventive concept.

FIG. 13 illustrates the k-th driving stage BSRCk, where k is a natural number greater than or equal to 2, from among the plurality of driving stages BSRC1 to BSRCn shown in FIG. 12. Each of the plurality of driving stages BSRC1 to BSRCn shown in FIG. 12 may have the same or substantially the same circuit structure as that of the k-th driving stage BSRCk. The driving stage BSRCk shown in FIG. 13 may receive a first clock signal CKV, but is not limited thereto and may receive a second clock signal CKVB instead of the first clock signal CKV.

Referring to FIG. 13, the k-th driving stage BSRCk includes an input circuit 410, a first output circuit 420, a second output circuit 430, a discharge hold circuit 440, a first pull down circuit 450, and a carry feedback circuit 470. The k-th driving stage BSRCk may further include a second pull down circuit 460.

Because the input circuit 410, the first output circuit 420, the second output circuit 430, the discharge hold circuit 440, the first pull down circuit 450, and the second pull down circuit 460 in the k-th driving stage BSRCk shown in FIG. 13 have the same or substantially the same configurations as those of the input circuit 210, the first output circuit 220, the second output circuit 230, the discharge hold circuit 240, the first pull down circuit 250, and the second pull down circuit 260 in the k-th driving stage SRCk shown in FIG. 6, overlapping description may be omitted.

The carry feedback circuit 470 feeds back the k-th carry signal CRk to the (k−1)th carry signal CRk−1 in response to a signal of the first node N1. The carry feedback circuit 470 may include a first feedback transistor TR21 and a second feedback transistor TR22.

The first feedback transistor TR21 includes a first electrode connected to the third input terminal IN3 for receiving the k-th carry signal CRk, a second electrode, and a gate electrode connected to the third input terminal IN3. The second feedback transistor TR22 includes a first electrode connected to the second electrode of the first feedback transistor TR21, a second electrode connected to the first input terminal IN1 for receiving the (k−1)th carry signal CRk−1 from the (k−1)th stage BSRCk−1, and a gate electrode connected to the first node N1.

Referring to FIGS. 7 and 13, during the second section P2, the first clock signal CKV shifts to a low level and the (k−1)th carry signal CRk−1 shifts to a high level. When the input transistor TR1 is turned on in response to the high-level (k−1)th carry signal CRk−1, the first node N1 is pre-charged to a set or predetermined voltage level (for example, a voltage level corresponding to the (k−1)th carry signal CRk−1).

If the first clock signal CKV shifts to a high level during a third section P3, as the first output transistor TR2 is turned on, a signal level of the first node N1 is boosted-up by the first capacitor C1, and the k-th gate signal Gk outputted to the gate output terminal OUT shifts to a high level. Moreover, if the first clock signal CKV shifts to a high level, as the second output transistor TR3 is turned on, the k-th carry signal CRk outputted to the carry output terminal CR shifts to a high level.

Figure 14:
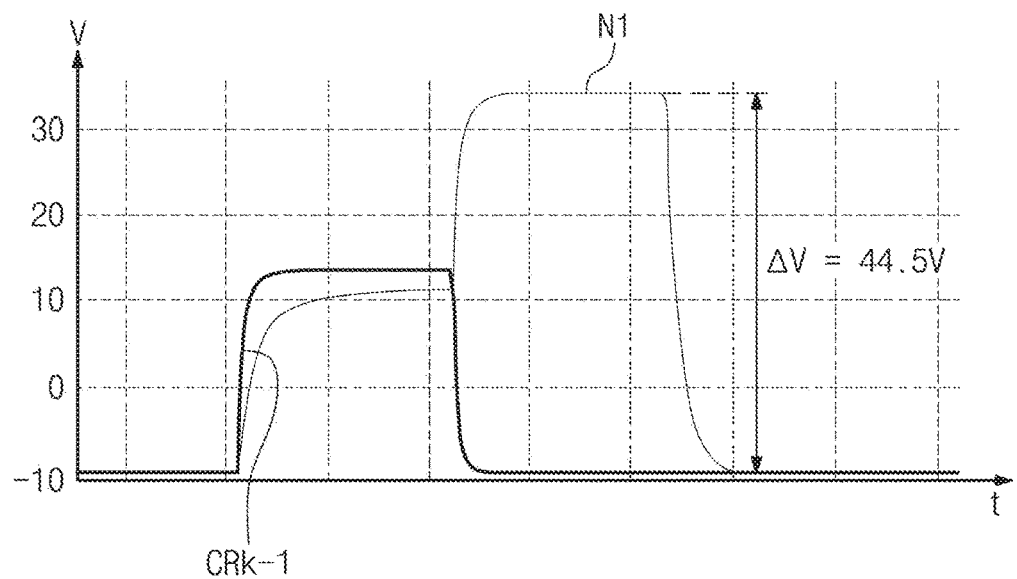
FIG. 14 is a view illustrating waveforms of signals applied to a first electrode and a second electrode of an input transistor when a carry feedback circuit shown in FIG. 13 does not operate.

FIG. 14 is a view illustrating waveforms of signals applied to a first electrode and a second electrode of an input transistor when a carry feedback circuit shown in FIG. 13 does not operate.

Referring to FIGS. 7, 13, and 14, the (k−1)th carry signal CRk−1 shifts from a high level to a low level during the third section P3. During the third section P3, the (k−1)th carry signal CRk−1 is provided to the first electrode (e.g., the drain electrode) of the input transistor TR1, and a voltage level of the first node N1 is provided to the second electrode (e.g., the source electrode) of the input transistor TR1. For example, when a voltage level of the (k−1)th carry signal CRk−1 is, for example, −10 V, and a voltage level of the first node N1 is, for example, +34.5 V, a voltage difference between the first electrode and the second electrode of the input transistor TR1 is 44.5 V. When the voltage difference between the drain-source electrodes of the input transistor TR1 is large, the input transistor TR1 may be deteriorated by high voltage stress.

Figure 15:
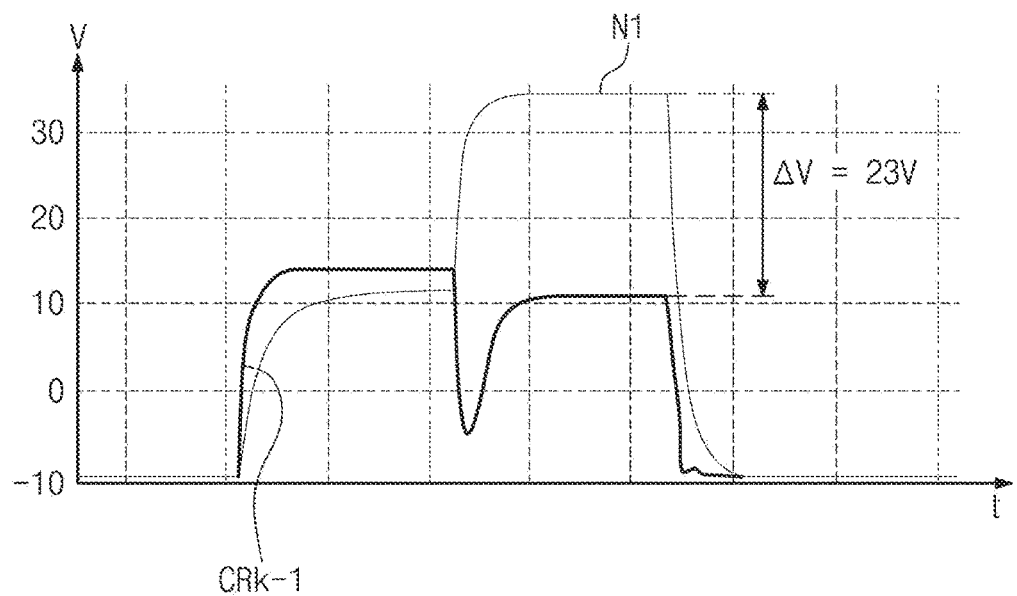
FIG. 15 is a view illustrating waveforms of signals applied to a first electrode and a second electrode of an input transistor when a carry feedback circuit shown in FIG. 13 operates.

FIG. 15 is a view illustrating waveforms of signals applied to a first electrode and a second electrode of an input transistor when a carry feedback circuit shown in FIG. 13 operates.

Referring to FIGS. 7, 13, and 15, the (k−1)th carry signal CRk−1 shifts to a low level and the k-th carry signal CRk shifts to a high level during the third section P3. In response to the high-level k-th carry signal CRk, the first feedback transistor TR21 is turned on, and in response to a high level signal of the first node N1, the second feedback transistor TR22 is turned on. When the first feedback transistor TR21 and the second feedback transistor TR22 are turned on, the k-th carry signal CRk is provided as the (k−1)th carry signal CRk−1 of the first input terminal IN1. For example, when the k-th carry signal CRk is +11.5 V and a voltage level of the first node N1 is +34.5 V during the third section P3, a voltage difference between the first electrode and the second electrode of the input transistor TR1 is 23 V. Because the voltage difference of the first electrode and the second electrode of the input transistor TR1 is 44.5 V in the above example shown in FIG. 14, the voltage difference between the drain-source electrodes of the input transistor TR1 is reduced by the carry feedback circuit 470 as shown in FIG. 15.

Figure 16:
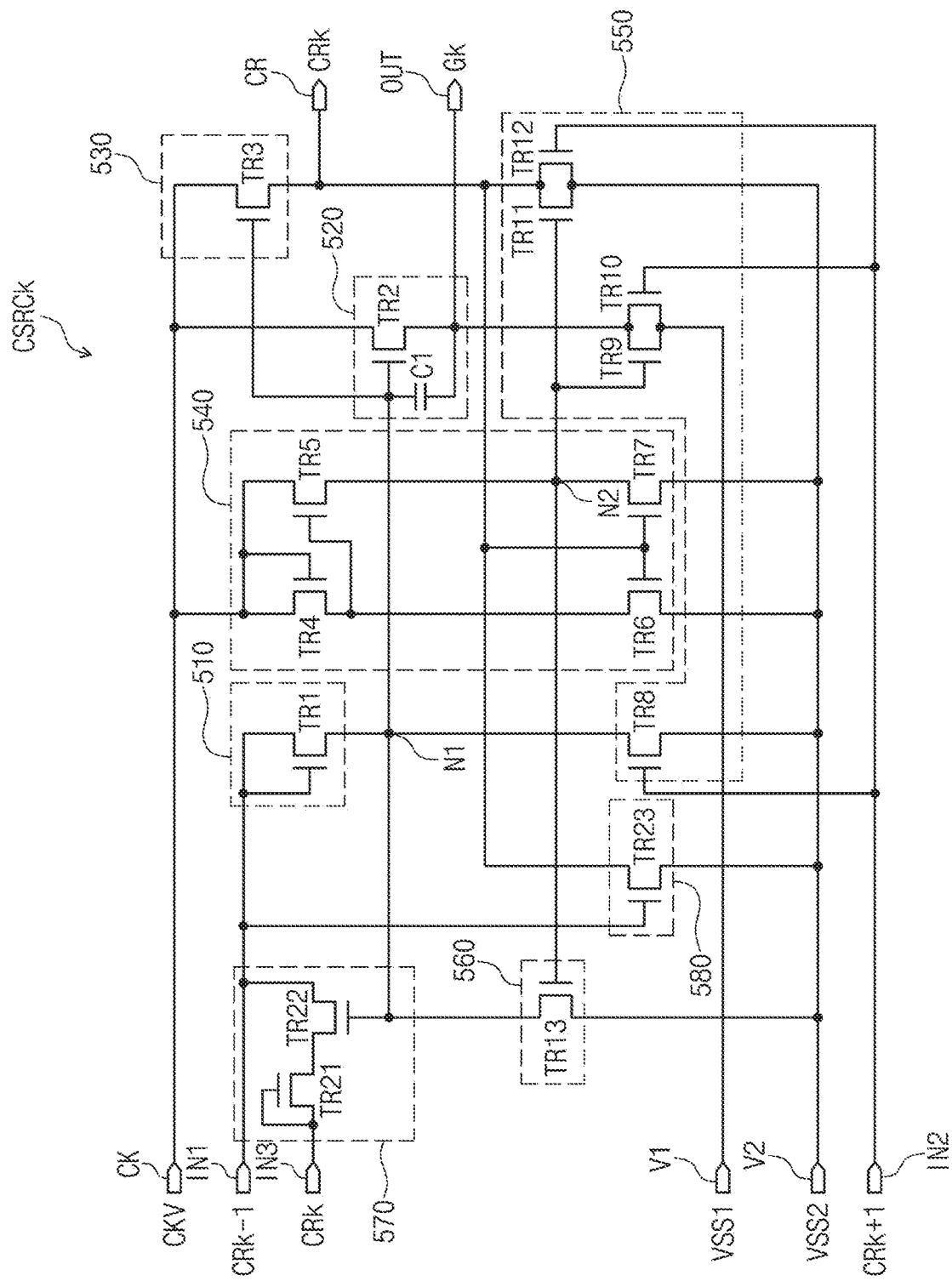
FIG. 16 is a circuit diagram illustrating a driving stage according to an embodiment of the inventive concept.

FIG. 16 is a circuit diagram illustrating a driving stage according to an embodiment of the inventive concept.

FIG. 16 is a view illustrating a k-th driving stage CSRCk, where k is a natural number greater than or equal to 2, from among the plurality of driving stages BSRC1 to BSRCn shown in FIG. 12. Each of the plurality of driving stages BSRC1 to BSRCn shown in FIG. 12 may have the same or substantially the same circuit structure as that of the k-th driving stage CSRCk shown in FIG. 16. The driving stage CSRCk shown in FIG. 16 may receive a first clock signal CKV, but is not limited thereto and may receive a second clock signal CKVB instead of the first clock signal CKV.

Referring to FIG. 16, the k-th driving stage CSRCk includes an input circuit 510, a first output circuit 520, a second output circuit 530, a discharge hold circuit 540, a first pull down circuit 550, a carry feedback circuit 570, and a discharge circuit 580. The k-th driving state CSRCk may further include a second pull down circuit 560.

Because the input circuit 510, the first output circuit 520, the second output circuit 530, the discharge hold circuit 540, the first pull down circuit 550, the second pull down circuit 560, and the carry feedback circuit 570 in the k-th driving stage CSRCk shown in FIG. 16 have the same or substantially the same configurations as those of the input circuit 410, the first output circuit 420, the second output circuit 430, the discharge hold circuit 440, the first pull down circuit 450, the second pull down circuit 460, and the carry feedback circuit 470 shown in FIG. 13, overlapping description may be omitted.

The discharge circuit 580 discharges the k-th carry signal CRk with the second low voltage VSS2 in response to the (k−1)th carry signal CRk−1. The discharge circuit 580 includes a first discharge transistor TR23. The first discharge transistor TR23 includes a first electrode connected to the carry output terminal CR, a second electrode connected to the second voltage terminal V2, and a gate electrode connected to the first input terminal IN1. The first discharge transistor TR23 is turned on during the second section P2 shown in FIG. 7, that is, while the (k−1)th carry signal CRk−1 is in a high level, and discharges the k-th carry signal CRk with the second low voltage VSS2. Therefore, even if a falling time of the first clock signal CKV is delayed, a clock racing effect may be prevented or reduced.

Figure 17:
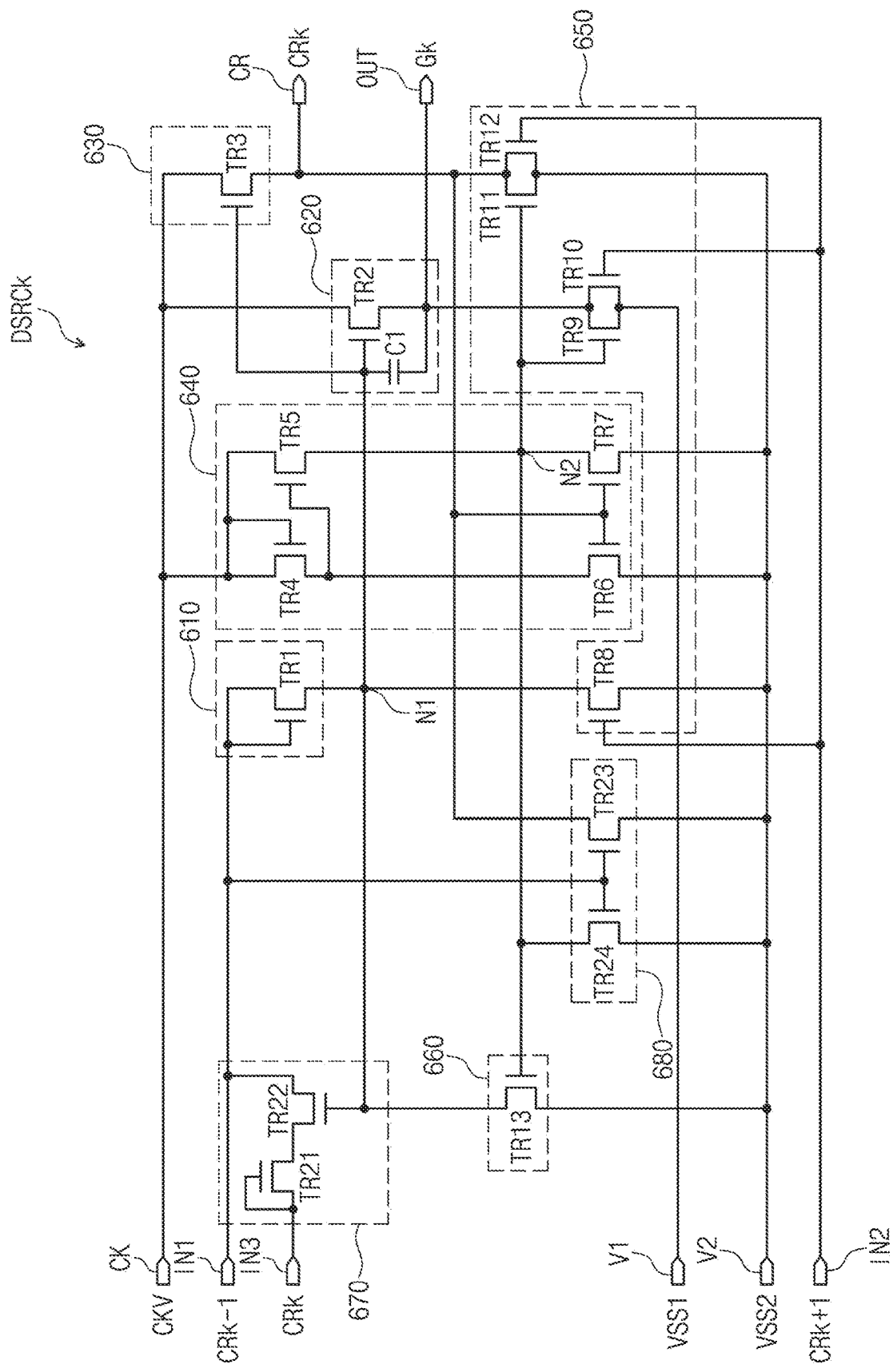
FIG. 17 is a circuit diagram illustrating a driving stage according to an embodiment of the inventive concept.

FIG. 17 is a circuit diagram illustrating a driving stage according to an embodiment of the inventive concept.

FIG. 17 is a view illustrating a k-th driving stage DSRCk, where k is a natural number greater than or equal to 2, from among the plurality of driving stages BSRC1 to BSRCn shown in FIG. 12. Each of the plurality of driving stages BSRC1 to BSRCn shown in FIG. 12 may have the same or substantially the same circuit structure as that of the k-th driving stage DSRCk shown in FIG. 17. The driving stage DSRCk shown in FIG. 17 may receive a first clock signal CKV, but may receive a second clock signal CKVB instead of the first clock signal CKV.

Referring to FIG. 17, the k-th driving stage DSRCk includes an input circuit 610, a first output circuit 620, a second output circuit 630, a discharge hold circuit 640, a first pull down circuit 650, a carry feedback circuit 670, and a discharge circuit 680. The k-th driving state DSRCk may further include a second pull down circuit 660.

Because the input circuit 610, the first output circuit 620, the second output circuit 630, the discharge hold circuit 640, the first pull down circuit 650, the second pull down circuit 660, and the carry feedback circuit 670 in the k-th driving stage DSRCk shown in FIG. 17 have the same or substantially the same configurations as those of the input circuit 510, the first output circuit 520, the second output circuit 530, the discharge hold circuit 540, the first pull down circuit 550, the second pull down circuit 560, and the carry feedback circuit 570 shown in FIG. 16, overlapping description may be omitted.

The discharge circuit 680 shown in FIG. 17 includes a first discharge transistor TR23 and a second discharge transistor TR24. The first discharge transistor TR23 includes a first electrode connected to the carry output terminal CR, a second electrode connected to the second voltage terminal V2, and a gate electrode connected to the first input terminal IN1. The second discharge transistor TR24 includes a first electrode connected to the second node N2, a second electrode connected to the second voltage terminal V2, and a gate electrode connected to the first input terminal IN1.

Due to long time driving or high temperature environment, the threshold voltage of the sixth pull down transistor TR13 in the second pull down circuit 660 may be shifted negatively. When the threshold voltage of the sixth pull down transistor TR13 is shifted negatively, and a falling time of the first clock signal CKV is delayed, the sixth pull down transistor TR13 may be turned on.

As the second discharge transistor TR24 is turned on when a high-level (k−1)th carry signal CRk−1 is received through the first input terminal IN1, the second discharge transistor TR24 discharges the second node N2 with the second low voltage VSS2. Therefore, during only the second section P2 shown in FIG. 7, the sixth pull down transistor TR13 may maintain or substantially maintain a turn off state.

Figure 18:
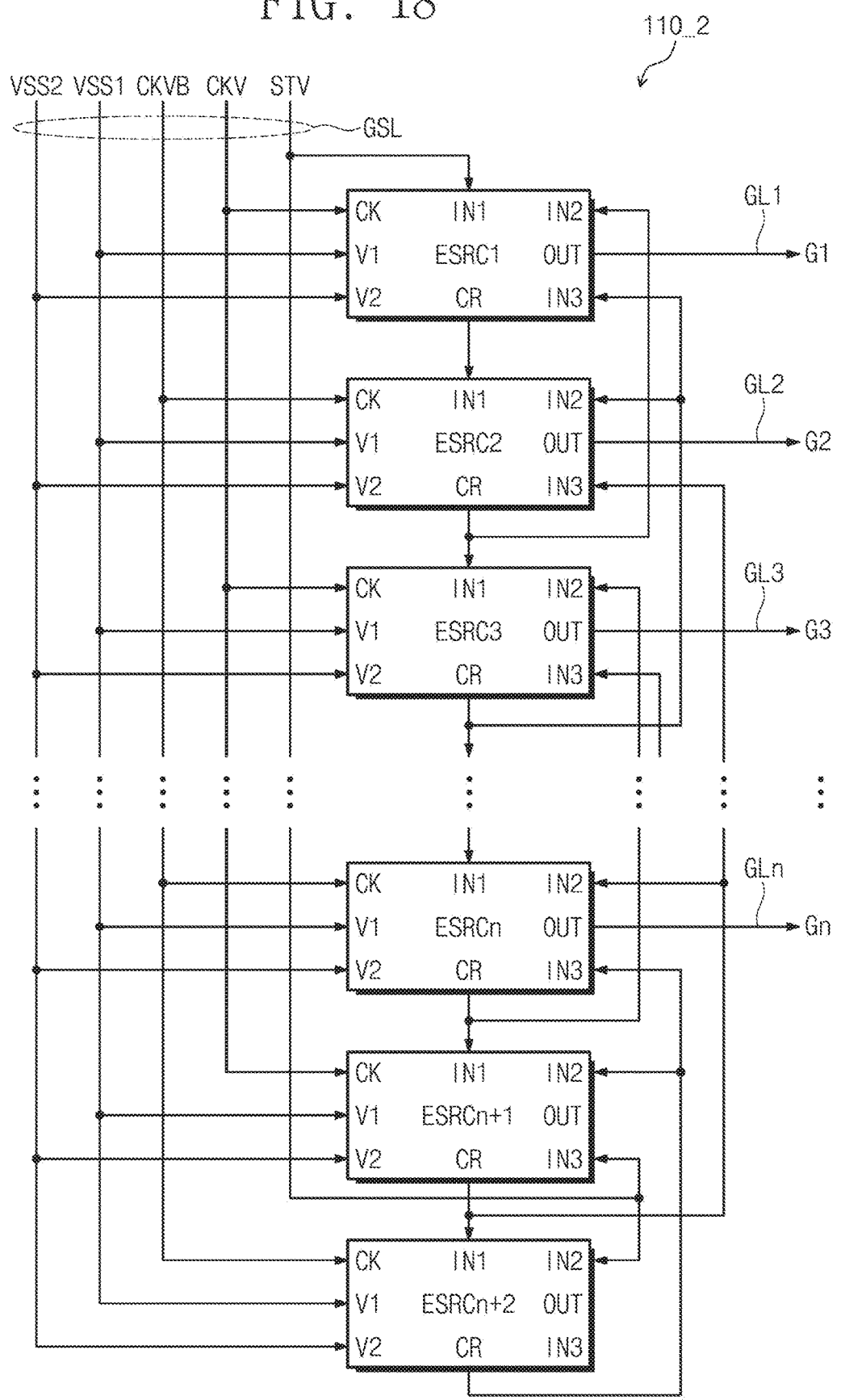
FIG. 18 is a block diagram illustrating a gate driving circuit according to another embodiment of the inventive concept.

FIG. 18 is a block diagram illustrating a gate driving circuit according to another embodiment of the inventive concept.

Referring to FIG. 18, a gate driving circuit 110_2 includes a plurality of driving stages ESRC1 to ESRCn and dummy driving stages ESRCn+1 and ESRCn+2. The plurality of driving stages ESRC1 to ESRCn and dummy driving stages ESRCn+1 to ESRCn+2 have a cascade relationship, in which they operate in response to a carry signal outputted from a previous stage and a carry signal outputted from a next stage.

Each of the plurality of driving stages ESRC1 to ESRCn receives a first low voltage VSS1, a second low voltage VSS2, and one of a first clock signal CKV and a second clock signal CKVB, from the driving controller 130 shown in FIG. 1. The first driving stage ESRC1 and each of the dummy driving stages ESRCn+1 and ESRCn+2 further receives a start signal STV.

According to an embodiment of the inventive concept, the plurality of driving stages ESRC1 to ESRCn are respectively connected to the plurality of gate lines GL1 to GLn. The plurality of driving stages ESRC1 to ESRCn provide gate signals G1 to Gn to the plurality of gate lines GL1 to GLn, respectively. According to an embodiment of the inventive concept, gate lines connected to the plurality of driving stages BSRC1 to BSRCn may be odd gate lines and/or even gate lines from among all of the gate lines.

Each of the plurality of driving stages ESRC1 to ESRCn and the dummy driving stages ESRCn+1 and ESRCn+2 includes a first input terminal IN1, a second input terminal IN2, a third input terminal IN3, a gate output terminal OUT, a carry output terminal CR, a clock terminal CK, a first voltage terminal (e.g., a first low voltage terminal or a first ground terminal) V1, and a second voltage terminal (e.g., a second low voltage terminal or a second ground terminal) V2.

The carry output terminal CR of each of the plurality of driving stages ESRC1 to ESRCn is electrically connected to the first input terminal IN1 of a next driving stage of a corresponding driving stage. Additionally, the carry output terminal CR of each of the plurality of driving stages ESRC2 to ESRCn, except for the first driving stage ESRC1, is electrically connected to the second input terminal IN2 of a previous driving stage and the third input terminal IN3 of a previous-previous driving stage. For example, the carry output terminal CR of a k-th driving stage ESRCk from among the driving stages ESRC1 to ESRCn is connected to the second input terminal IN2 of a (k−1)th driving stage ESRCk−1, the first input terminal IN1 of a (k+1)th driving stage ESRCk+1, and the third input terminal IN3 of a k−2th driving stage ESRCk−2. The carry output terminal CR of each of the plurality of driving stages ESRC1 to ESRCn and the dummy driving stages ESRCn+1 and ESRCn+2 outputs a carry signal.

Because the first input terminal IN1, the second input terminal IN2, the first voltage terminal V1, the second voltage terminal V2, and the gate output terminal OUT of each of the plurality of driving stages ESRC1 to ESRCn shown in FIG. 18 have the same or substantially the same configurations as those of the first input terminal IN1, the second input terminal IN2, the first voltage terminal V1, the second voltage terminal V2, and the gate output terminal OUT of each of the plurality of driving stages BSRC1 to BSRCn shown in FIG. 12, overlapping descriptions are omitted.

Figure 19:
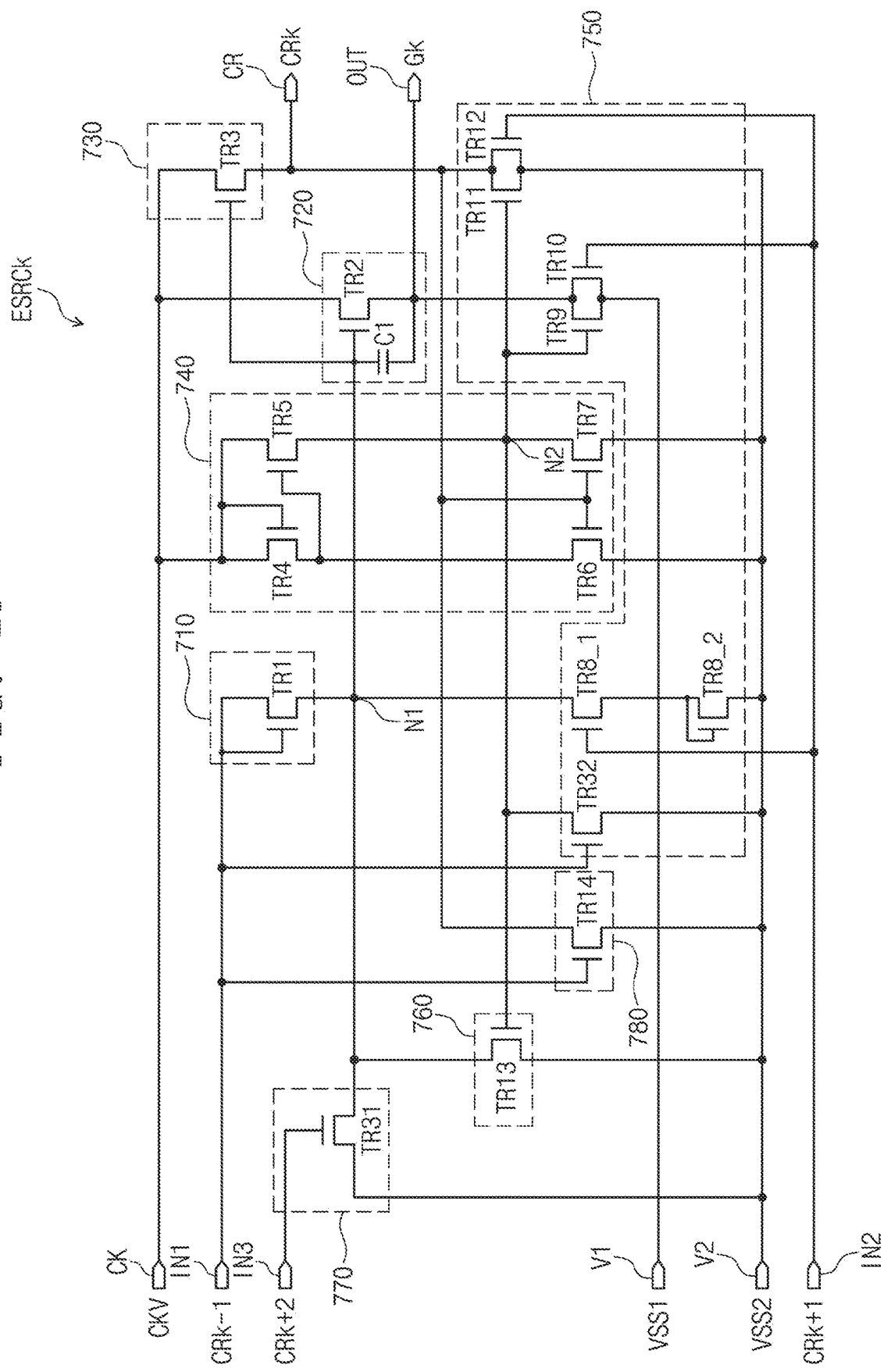
FIG. 19 is a circuit diagram of a driving stage according to an embodiment of the inventive concept.

FIG. 19 is a circuit diagram of a driving stage according to an embodiment of the inventive concept.

FIG. 19 illustrates a k-th driving stage ESRCk, where k is a natural number greater than or equal to 2, from among the plurality of driving stages ESRC1 to ESRCn shown in FIG. 18. Each of the plurality of driving stages ESRC1 to ESRCn shown in FIG. 18 may have the same or substantially the same circuit structure as that of the k-th driving stage ESRCk. The driving stage ESRCk shown in FIG. 19 may receive a first clock signal CKV, but is not limited thereto and may receive a second clock signal CKVB instead of the first clock signal CKV.

Referring to FIG. 19, the k-th driving stage ESRCk includes an input circuit 710, a first output circuit 720, a second output circuit 730, a discharge hold circuit 740, a first pull down circuit 750, a second pull down circuit 760, a third pull down circuit 770, and a discharge circuit 780.

Because the input circuit 710, the first output circuit 720, the second output circuit 730, the discharge hold circuit 740, and the second pull down circuit 760 in the k-th driving stage ESRCk shown in FIG. 19 have the same or substantially the same configurations as those of the input circuit 210, the first output circuit 220, the second output circuit 230, the discharge hold circuit 240, and the second pull down circuit 260 in the k-th driving stage SRCk shown in FIG. 6, overlapping description may be omitted.

The first pull down circuit 750 discharges the k-th gate signal Gk with the first low voltage VSS1, and discharges the first node N1 and the k-th carry signal CRk with the second low voltage VSS2, in response to a signal of the second node N2 and the (k+1)th carry signal CRk+1 from a (k+1)th stage ESRCk+1. The first pull down circuit 750 includes first to seventh pull down transistors TR8_1, TR8_2, TR9, TR10, TR11, TR12, and TR32. The first pull down transistor TR8_1 includes a first electrode connected to the first node N1, a second electrode, and a gate electrode connected to the second input terminal IN2. The second pull down transistor TR8_2 includes a first electrode connected to the second electrode of the first pull down transistor TR8_1, a second electrode connected to the second voltage terminal V2, and a gate electrode connected to the second electrode of the first pull down transistor TR8_1. The third pull down transistor TR9 includes a first electrode connected to the gate output terminal OUT, a second electrode connected to the first voltage terminal V1 for receiving the first low voltage VSS1, and a gate electrode connected to the second node N2. The fourth pull-down transistor TR10 includes a first electrode connected to the gate output terminal OUT, a second electrode connected to the first voltage terminal V1, and a gate electrode connected to the second input terminal IN2 for receiving the (k+1)th carry signal CRk+1 from the (k+1)th stage ESRCk+1. The fifth pull down transistor TR11 includes a first electrode connected to the carry output terminal CR, a second electrode connected to the second voltage terminal V2, and a gate electrode connected to the second node N2. The sixth pull down transistor TR12 includes a first electrode connected to the carry output terminal CR, a second electrode connected to the second voltage terminal V2, and a gate electrode connected to the second input terminal IN2. The seventh pull down transistor TR32 includes a first electrode connected to the second node N2, a second electrode connected to the second voltage terminal V2, and a gate electrode connected to the first input terminal IN1.

The second pull down circuit 760 discharges the first node N1 with the second low voltage VSS2 in responds to a signal of the second node N2. The second pull-down circuit 760 includes a seventh pull-down transistor TRG13. The seventh pull down transistor TRG13 includes a first electrode connected to the first node N1, a second electrode connected to the second voltage terminal V2, and a gate electrode connected to the second node N2.

The third pull down circuit 770 discharges the first node N1 with the second low voltage VSS2 in response to the next-next carry signal CRk+2 from a next-next stage ESRCk+2. The third pull down circuit 770 includes an eighth pull down transistor TR31. The eighth pull down transistor T31 includes a first electrode connected to the first node N1, a second electrode connected to the second voltage terminal V2, and a gate electrode connected to the third input terminal IN3.

The discharge circuit 780 discharges the k-th carry signal CRk with the second low voltage VSS2 in response to the (k−1)th carry signal CRk−1. The discharge circuit 780 includes a discharge transistor TR14. The discharge transistor TR14 includes a first electrode connected to the carry output terminal CR, a second electrode connected to the second voltage terminal V2, and a gate electrode connected to the first input terminal IN1. As the discharge transistor TR14 in the discharge circuit 780 is turned on and discharges the k-th carry signal CRk with the second low voltage VSS2 while the (k−1)th carry signal CRk−1 is in a high level, a clock racing effect may be prevented or reduced.

Figure 20:
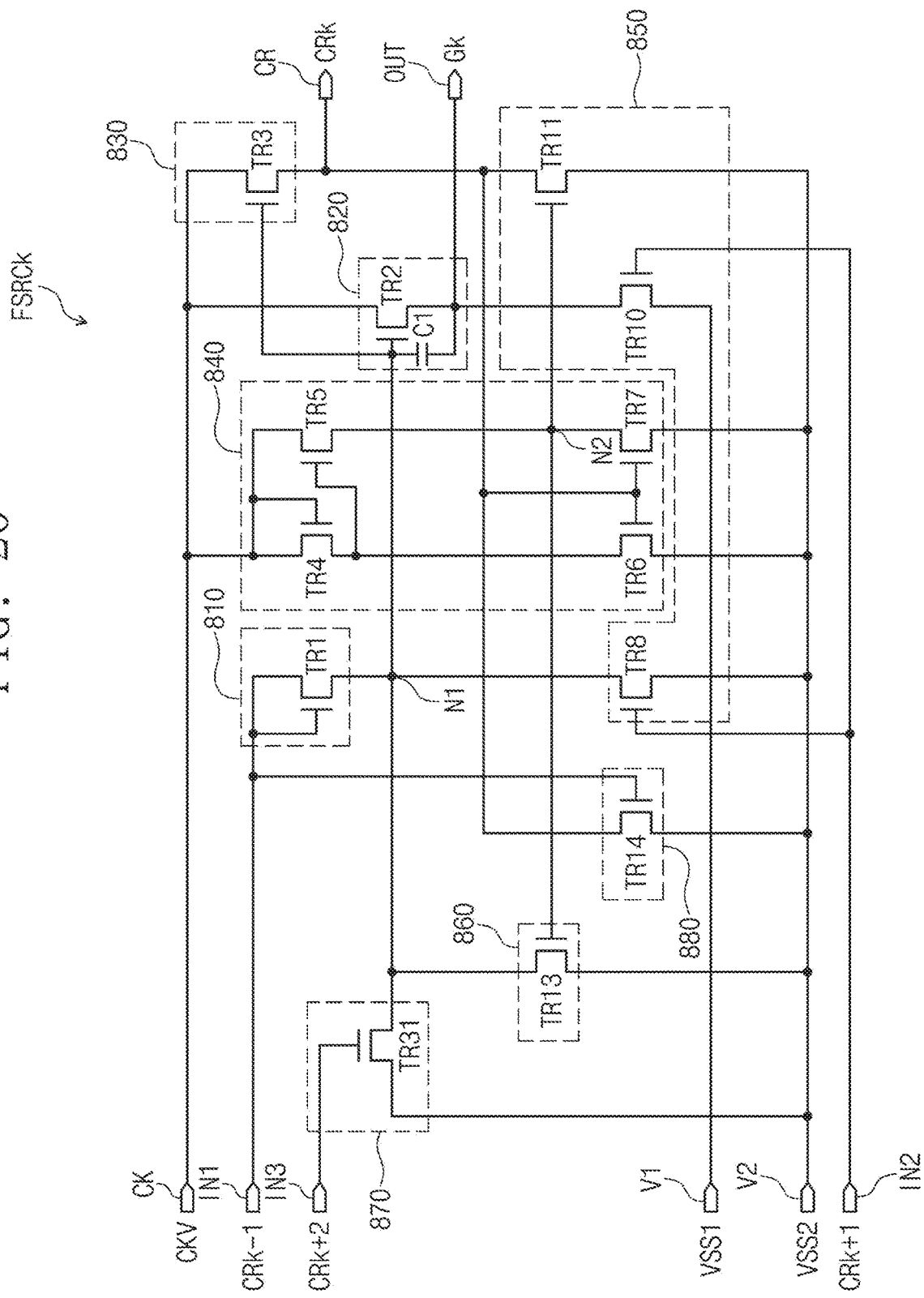
FIG. 20 is a circuit diagram illustrating a driving stage according to an embodiment of the inventive concept.

FIG. 20 is a circuit diagram illustrating a driving stage according to an embodiment of the inventive concept.

FIG. 20 illustrates a k-th driving stage FSRCk, where k is a natural number greater than or equal to 2, from among the plurality of driving stages ESRC1 to ESRCn shown in FIG. 18. Each of the plurality of driving stages ESRC1 to ESRCn shown in FIG. 18 may have the same or substantially the same circuit structure as that of the k-th driving stage FSRCk shown in FIG. 20. The k-th driving stage FSRCk shown in FIG. 20 may receive a first clock signal CKV, but may receive a second clock signal CKVB instead of the first clock signal CKV.

Referring to FIG. 20, the k-th driving stage FSRCk includes an input circuit 810, a first output circuit 820, a second output circuit 830, a discharge hold circuit 840, a first pull down circuit 850, a second pull down circuit 860, a third pull down circuit 870, and a discharge circuit 880.

Because the input circuit 810, the first output circuit 820, the second output circuit 830, the discharge hold circuit 840, the second pull down circuit 860, and the third pull down circuit 870 in the k-th driving stage FSRCk shown in FIG. 20 have the same or substantially the same configurations as those of the input circuit 710, the first output circuit 720, the second output circuit 730, the discharge hold circuit 740, the second pull down circuit 760, and the third pull down circuit 770 in the k-th driving stage ESRCk shown in FIG. 19, overlapping description may be omitted.

The first pull down circuit 850 discharges the k-th gate signal Gk with the first low voltage V1, and discharges the first node N1 and the k-th carry signal CRk with the second low voltage VSS2, in response to a signal of the second node N2 and the (k+1)th carry signal CRk+1 from a (k+1)th stage FSRCk+1. The first pull down circuit 850 includes first to third pull down transistors TR8, TR10, and TR11. The first pull down transistor TR8 includes a first electrode connected to the first node N1, a second electrode connected to the second voltage terminal V2, and a gate electrode connected to the second input terminal IN2 for receiving the (k+1)th carry signal CRk+1 from the (k+1)th stage FSRCk+1. The second pull down transistor TR10 includes a first electrode connected to the gate output terminal OUT, a second electrode connected to the first voltage terminal V1, and a gate electrode connected to the second input terminal IN2. The third pull down transistor TR11 includes a first electrode connected to the carry output terminal CR, a second electrode connected to the second voltage terminal V2, and a gate electrode connected to the second node N2.

The discharge circuit 880 discharges the k-th carry signal CRk with the second low voltage VSS2 in response to the (k−1)th carry signal CRk−1. The discharge circuit 880 includes a discharge transistor TR14. The discharge transistor TR14 includes a first electrode connected to the carry output terminal CR, a second electrode connected to the second voltage terminal V2, and a gate electrode connected to the first input terminal IN1. As the discharge transistor TR14 in the discharge circuit 880 is turned on and discharges the k-th carry signal CRk with the second low voltage VSS2 while the (k−1)th carry signal CRk−1 is in a high level, a clock racing effect may be prevented or reduced.

Figure 21:
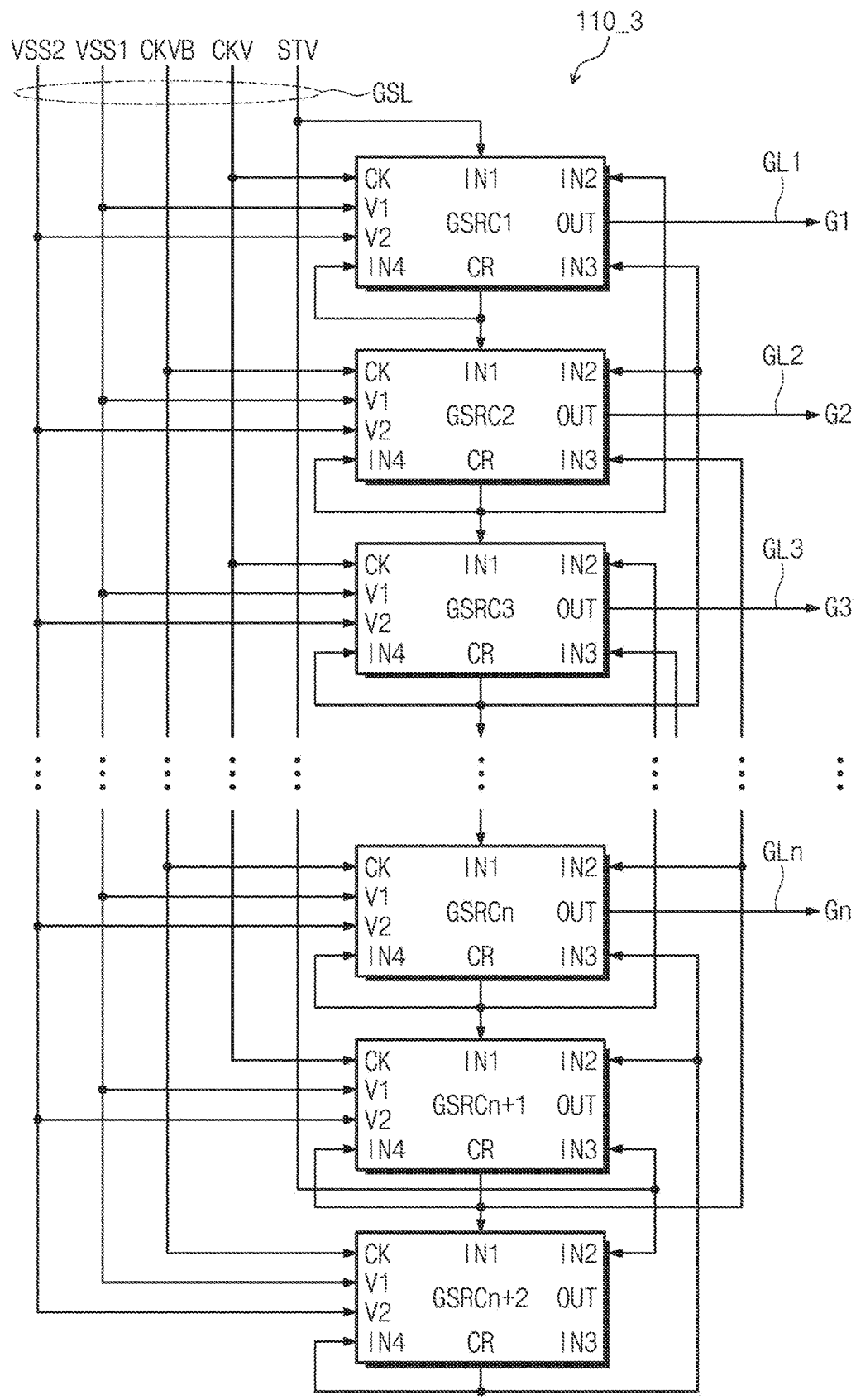
FIG. 21 is a block diagram illustrating a gate driving circuit according to another embodiment of the inventive concept.

FIG. 21 is a block diagram illustrating a gate driving circuit according to another embodiment of the inventive concept.

Referring to FIG. 21, a gate driving circuit 110_3 includes a plurality of driving stages GSRC1 to GSRCn and dummy driving stages GSRCn+1 and GSRCn+2. The plurality of driving stages GSRC1 to GSRCn and dummy driving stages GSRCn+1 to GSRCn+2 have a cascade relationship, in which they operate in response to a carry signal outputted from a previous stage and a carry signal outputted from a next stage.

Each of the plurality of driving stages GSRC1 to GSRCn receives a first low voltage (e.g., a first ground voltage) VSS1, a second low voltage (e.g., a second ground voltage) VSS2, and one of a first clock signal CKV and a second clock signal CKVB, from the driving controller 130 shown in FIG. 1. The first driving stage GSRC1 and each of the dummy driving stages GSRCn+1 and GSRCn+2 further receives a start signal STV.

According to an embodiment of the inventive concept, the plurality of driving stages GSRC1 to GSRCn are respectively connected to the plurality of gate lines GL1 to GLn. The plurality of driving stages GSRC1 to GSRCn provide gate signals G1 to Gn to the plurality of gate lines GL1 to GLn, respectively. According to an embodiment of the inventive concept, gate lines connected to the plurality of driving stages GSRC1 to GSRCn may be odd gate lines and/or even gate lines from among all of the gate lines.

Each of the plurality of driving stages GSRC1 to GSRCn and the dummy driving stages GSRCn+1 and GSRCn+2 includes a first input terminal IN1, a second input terminal IN2, a third input terminal IN3, a fourth input terminal IN4, a gate output terminal OUT, a carry output terminal CR, a clock terminal CK, a first voltage terminal (e.g., a first low voltage terminal or a first ground terminal) V1, and a second voltage terminal (e.g., a second low voltage terminal or a second ground terminal) V2.

The carry output terminal CR of each of the plurality of driving stages GSRC1 to GSRCn is electrically connected to the first input terminal IN1 of a next driving stage of a corresponding driving stage. Additionally, the carry output terminal CR of each of the plurality of driving stages GSRC2 to GSRCn, except for the first driving stage GSRC1, is electrically connected to the second input terminal IN2 of a previous driving stage, the third input terminal IN3 of a previous-previous driving stage, and the fourth input terminal IN3 of a current driving stage. For example, the carry output terminal CR of a k-th driving stage GSRCk from among the driving stages GSRC1 to GSRCn is connected to the second input terminal IN2 of a (k−1)th driving stage GSRCk−1, the first input terminal IN1 of a (k+1)th driving stage GSRCk+1, the third input terminal IN3 of a (k−2)th driving stage ESRCk−2, and the fourth input terminal IN4 of the current driving stage ESRCk. The carry output terminal CR of each of the plurality of driving stages GSRC1 to GSRCn and the dummy driving stages GSRCn+1 and GSRCn+2 outputs a carry signal.

Because the first input terminal IN1, the second input terminal IN2, the third input terminal IN3, the first voltage terminal V1, the second voltage terminal V2, and the gate output terminal OUT in each of the plurality of driving stages GSRC1 to GSRCn shown in FIG. 21 have the same or substantially the same configurations as those the first input terminal IN1, the second input terminal IN2, the third input terminal IN3, the first voltage terminal V1, the second ground germinal V2, and the gate output terminal OUT of each of the plurality of driving stages ESRC1 to ESRCn shown in FIG. 18, overlapping descriptions are omitted.

Figure 22:
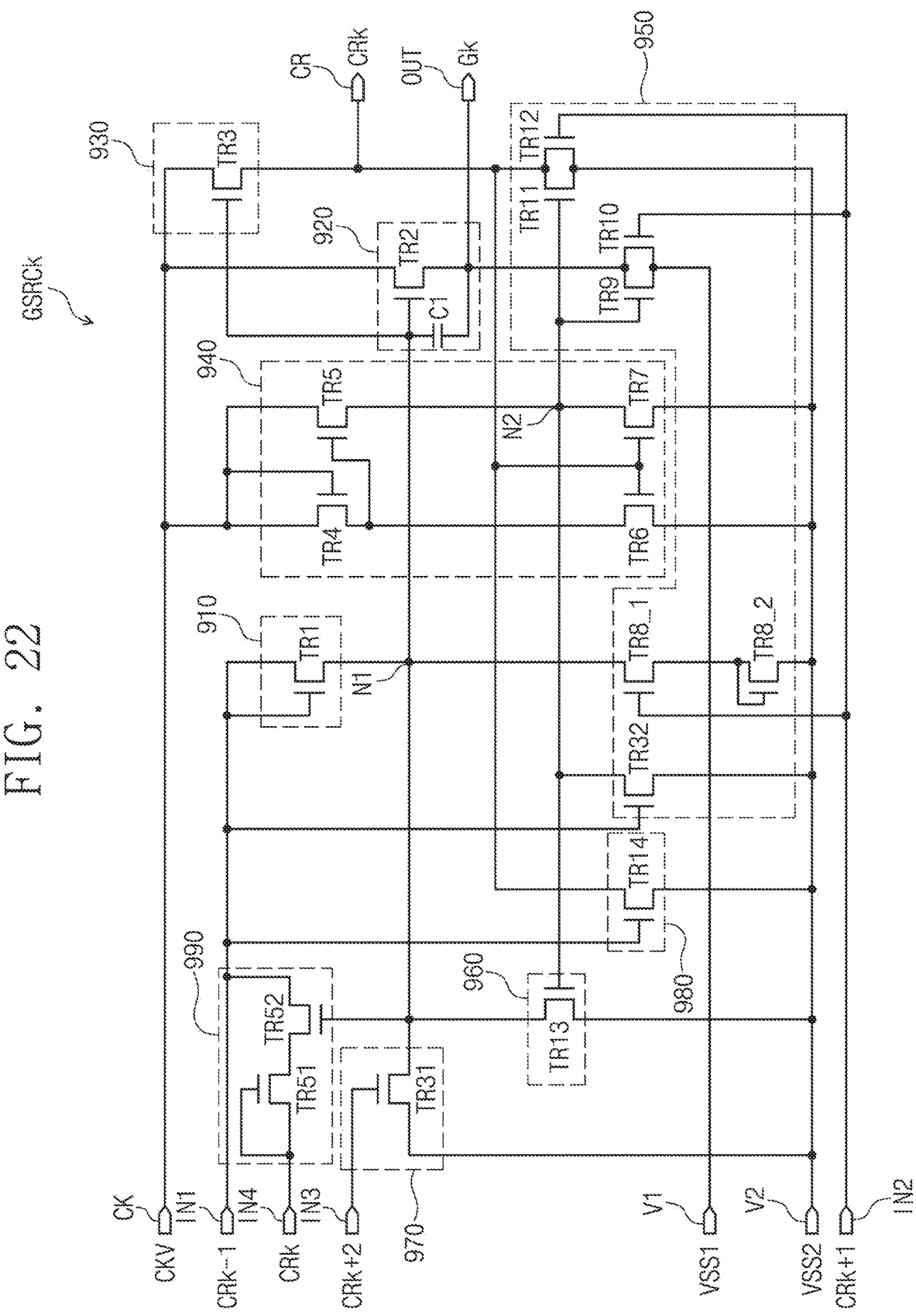
FIG. 22 is a circuit diagram of a driving stage according to an embodiment of the inventive concept.

FIG. 22 is a circuit diagram of a driving stage according to an embodiment of the inventive concept.

FIG. 22 illustrates the k-th driving stage GSRCk, where k is a natural number greater than or equal to 2, from among the plurality of driving stages GSRC1 to GSRCn shown in FIG. 21. Each of the plurality of driving stages GSRC1 to GSRCn shown in FIG. 21 may have the same or substantially the same circuit structure as that of the k-th driving stage GSRCk. The k-th driving stage GSRCk shown in FIG. 21 may receive a first clock signal CKV, but may receive a second clock signal CKVB instead of the first clock signal CKV.

Referring to FIG. 22, the k-th driving stage GSRCk includes an input circuit 910, a first output circuit 920, a second output circuit 930, a discharge hold circuit 940, a first pull down circuit 950, a second pull down circuit 960, a third pull down circuit 970, a discharge circuit 980, and a carry feedback circuit 990.

Because the input circuit 910, the first output circuit 920, the second output circuit 930, the discharge hold circuit 940, the first pull down circuit 950, the second pull down circuit 960, the third pull down circuit 970, and the discharge circuit 980 in the k-th driving stage GSRCk shown in FIG. 22 have the same or substantially the same configurations as those of the input circuit 710, the first output circuit 720, the second output circuit 730, the discharge hold circuit 740, the first pull down circuit 750, the second pull down circuit 760, the third pull down circuit 770, and the discharge circuit 780 in the k-th driving stage ESRCk shown in FIG. 19, overlapping description may be omitted.

The carry feedback circuit 990 feeds back the k-th carry signal CRk to the (k−1)th carry signal CRk−1 in response to a signal of the first node N1. The carry feedback circuit 990 may include a first feedback transistor TR51 and a second feedback transistor TR52.

The first feedback transistor TR51 includes a first electrode connected to the fourth input terminal IN4 for receiving the k-th carry signal CRk, a second electrode, and a gate electrode connected to the fourth input terminal IN4. The second feedback transistor TR52 includes a first electrode connected to the second electrode of the first feedback transistor TR51, a second electrode connected to the first input terminal IN1 for receiving the (k−1)th carry signal CRk−1 from a (k−1)th stage GSRCk−1, and a gate electrode connected to the first node N1.

Referring to FIGS. 7 and 22, the (k−1)th carry signal CRk−1 shifts to a low level and the k-th carry signal CRk shifts to a high level during the third section P3. In response to the high-level k-th carry signal CRk, the first feedback transistor TR51 is turned on, and in response to a high level signal of the first node N1, the second feedback transistor TR52 is turned on. When the first feedback transistor TR51 and the second feedback transistor TR52 are all turned on, the k-th carry signal CRk is provided as the (k−1)th carry signal CRk−1 of the first input terminal IN1. For example, when the k-th carry signal CRk is +11.5 V and a voltage level of the first node N1 is +34.5 V during the third section P3, a voltage difference between the first electrode and the second electrode of the input transistor TR1 is 23.5 V. By reducing the voltage difference between the drain-source electrodes of the input transistor TR1, the deterioration of the input transistor TR1 due to high voltage stress may be prevented or reduced.

Figure 23:
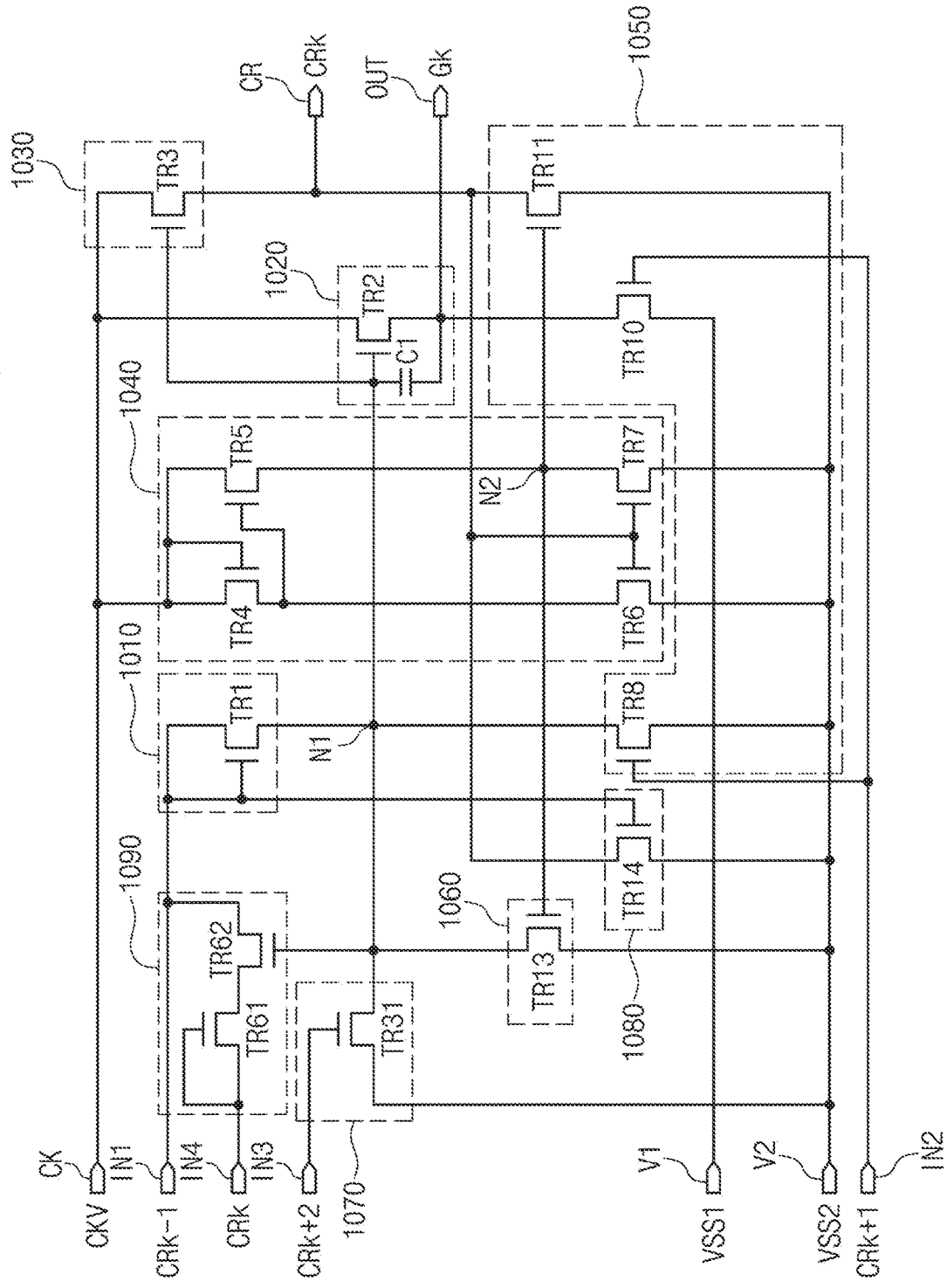
FIG. 23 is a circuit diagram illustrating a driving stage according to an embodiment of the inventive concept.

FIG. 23 is a circuit diagram illustrating a driving stage according to an embodiment of the inventive concept.

FIG. 23 illustrates a k-th driving stage HSRCk, where k is a natural number greater than or equal to 2, from among the plurality of driving stages GSRC1 to GSRCn shown in FIG. 21. Each of the plurality of driving stages GSRC1 to GSRCn shown in FIG. 21 may have the same or substantially the same circuit structure as that of the k-th driving stage HSRCk shown in FIG. 23. The k-th driving stage HSRCk shown in FIG. 23 may receive a first clock signal CKV, but may receive a second clock signal CKVB instead of the first clock signal CKV.

Referring to FIG. 23, the k-th driving stage HSRCk includes an input circuit 1010, a first output circuit 1020, a second output circuit 1030, a discharge hold circuit 1040, a first pull down circuit 1050, a second pull down circuit 1060, a third pull down circuit 1070, a discharge circuit 1080, and a carry feedback circuit 1090.

Because the input circuit 1010, the first output circuit 1020, the second output circuit 1030, the discharge hold circuit 1040, the first pull down circuit 1050, the second pull down circuit 1060, the third pull down circuit 1070, and the discharge circuit 980 in the k-th driving stage HSRCk shown in FIG. 23 have the same or substantially the same configurations as those of the input circuit 810, the first output circuit 820, the second output circuit 830, the discharge hole circuit 840, the first pull down circuit 850, the second pull down circuit 860, the third pull down circuit 870, and the discharge circuit 880 in the k-th driving stage FSRCk shown in FIG. 20, overlapping description may be omitted.

The carry feedback circuit 1090 feeds back the k-th carry signal CRk to the (k−1)th carry signal CRk−1 in response to a signal of the first node N1. The carry feedback circuit 1090 may include a first feedback transistor TR61 and a second feedback transistor TR62.

The first feedback transistor TR61 includes a first electrode connected to the fourth input terminal IN4 for receiving the k-th carry signal CRk, a second electrode, and a gate electrode connected to the fourth input terminal IN4. The second feedback transistor TR62 includes a first electrode connected to the second electrode of the first feedback transistor TR61, a second electrode connected to the first input terminal IN1 for receiving the (k−1)th carry signal CRk−1 from a (k−1)th stage HSRCk−1, and a gate electrode connected to the first node N1.

Referring to FIGS. 7 and 23, the (k−1)th carry signal CRk−1 shifts to a low level and the k-th carry signal CRk shifts to a high level during the third section P3. In response to the high-level k-th carry signal CRk, the first feedback transistor TR61 is turned on, and in response to a high level signal of the first node N1, the second feedback transistor TR62 is turned on. When the first feedback transistor TR61 and the second feedback transistor TR62 are turned on, the k-th carry signal CRk is provided as the (k−1)th carry signal CRk−1 of the first input terminal IN1. For example, when the k-th carry signal CRk is +11.5 V and a voltage level of the first node N1 is +34.5 V during the third section P3, a voltage difference between the first electrode and the second electrode of the input transistor TR1 is 23.5 V. By reducing the voltage difference between the drain-source electrodes of the input transistor TR1, the deterioration of the input transistor TR1 due to high voltage stress may be prevented or reduced.

A gate driving circuit having such a configuration may discharge a carry signal of the current stage with a low (e.g., ground) voltage in response to a carry signal outputted from a previous stage. Therefore, the reliability deterioration of a gate driving circuit due to the falling time delay of a clock signal and the threshold voltage shift of a transistor may be prevented or substantially prevented.

Additionally, by reducing a voltage difference between a drain electrode and a source electrode of an input transistor for receiving a carry signal from a previous stage, the deterioration of a transistor may be prevented or reduced. Therefore, the reliability deterioration of a gate driving circuit and a display device including the same may be prevented or reduced.

Although exemplary embodiments of the present invention have been described, it is understood that the present invention should not be limited to these exemplary embodiments, but various changes and modifications can be made by one ordinary skilled in the art within the spirit and scope of the present invention, as defined in the following claims and their equivalents.

What is claimed is:

1. A gate driving circuit comprising:
    a plurality of stages configured to provide gate signals to gate lines of a display panel, wherein a k-th stage from among the plurality of stages, where k is a natural number greater than or equal to 2, comprises:
        an input circuit connected to a first carry input terminal for receiving a first carry signal from one of previous stages from among the plurality of stages, and configured to pre-charge a first node;
        a first output circuit configured to output a clock signal as a gate signal in response to a signal of the first node;
        a second output circuit configured to output the clock signal as a second carry signal in response to the signal of the first node;
        a discharge hold circuit configured to transmit the clock signal to a second node in response to the clock signal, and to discharge the second node with a second low voltage in response to the second carry signal;
        a first pull down circuit configured to discharge the gate signal with a first low voltage in response to a signal of the second node and a third carry signal from one of next stages from among the plurality of stages, and to discharge the first node and the second carry signal with the second low voltage;
        a discharge circuit configured to discharge the second carry signal with the second low voltage and to discharge the second node with the second low voltage in response to the first carry signal, the discharge circuit comprising:
            a first discharge transistor to discharge the second carry signal with the second low voltage in response to the first carry signal; and a second discharge transistor to discharge the second node with the second low voltage in response to the first carry signal; and a carry feedback circuit configured to feedback the second carry signal to the first carry input terminal in response to the signal of the first node.

2. The gate driving circuit of claim 1, wherein the first discharge transistor comprises a first electrode connected to a carry output terminal for outputting the second carry signal, a second electrode connected to a second voltage terminal for receiving the second low voltage, and a gate electrode connected to a first input terminal for receiving the first carry signal from the one of the previous stages.

3. The gate driving circuit of claim 1, wherein the discharge hold circuit comprises:

a first hold transistor comprising a first electrode connected to a clock terminal for receiving the clock signal, a second electrode, and a gate electrode connected to the clock terminal;

a second hold transistor comprising a first electrode connected to the clock terminal, a second electrode connected to the second node, and a gate electrode connected to the second electrode of the first hold transistor;

a third hold transistor comprising a first electrode connected to the second electrode of the first hold transistor, a second electrode connected to a second voltage terminal for receiving the second low voltage, and a gate electrode connected to a carry output terminal for outputting the second carry signal; and a fourth hold transistor comprising a first electrode connected to the second node, a second electrode connected to the second voltage terminal, and a gate electrode connected to the carry output terminal.

4. The gate driving circuit of claim 1, wherein the first pull down circuit comprises:

a first pull down transistor comprising a first electrode connected to the first node, a second electrode connected to a second voltage terminal for receiving the second low voltage, and a gate electrode connected to a second input terminal for receiving the third carry signal;

a second pull down transistor comprising a first electrode connected to a gate output terminal for outputting the gate signal, a second electrode connected to a first voltage terminal for receiving the first low voltage, and a gate electrode connected to the second node;

a third pull down transistor comprising a first electrode connected to the gate output terminal, a second electrode connected to the first voltage terminal, and a gate electrode connected to the second input terminal;

a fourth pull down transistor comprising a first electrode connected to a carry output terminal for outputting the second carry signal, a second electrode connected to the second voltage terminal, and a gate electrode connected to the second node; and a fifth pull down transistor comprising a first electrode connected to the carry output terminal, a second electrode connected to the second voltage terminal, and a gate electrode connected to the second input terminal.

5. The gate driving circuit of claim 4, further comprising a second pull down circuit configured to discharge the first node with the second low voltage in response to a signal of the second node.

6. The gate driving circuit of claim 5, wherein the second pull down circuit comprises a sixth pull down transistor comprising a first electrode connected to the first node, a second electrode connected to the second voltage terminal, and a gate electrode connected to the second node.

7. The gate driving circuit of claim 2, wherein the second discharge transistor comprises a first electrode connected to the second node, a second electrode connected to the second voltage terminal, and a gate electrode connected to the first input terminal.

8. A gate driving circuit comprising:

a plurality of stages configured to provide gate signals to gate lines of a display panel, wherein a k-th stage from among the plurality of stages, where k is a natural number greater than or equal to 2, comprises:

an input circuit connected to a first carry input terminal for receiving a first carry signal from one of previous stages from among the plurality of stages, and configured to pre-charge a first node;

a first output circuit configured to output a clock signal as a gate signal in response to a signal of the first node;

a second output circuit configured to output the clock signal as a second carry signal in response to the signal of the first node;

a discharge hold circuit configured to transmit the clock signal to a second node in response to the clock signal, and to discharge the second node with a second low voltage in response to the second carry signal;

a first pull down circuit configured to discharge the gate signal with a first low voltage in response to a signal of the second node and a third carry signal from one of next stages from among the plurality of stages, and to discharge the first node and the second carry signal with the second low voltage;

a second pull down circuit configured to discharge the first node with the second low voltage in response to a signal of the second node;

a third pull down circuit configured to discharge the first node with the second low voltage in response to a fourth carry signal from another of the next stages;

a discharge circuit configured to discharge the second carry signal with the second low voltage in response to the first carry signal; and a carry feedback circuit configured to feedback the second carry signal to the first carry input terminal in response to the signal of the first node.

9. The gate driving circuit of claim 8, wherein the discharge circuit comprises a first discharge transistor comprising a first electrode connected to a carry output terminal for outputting the second carry signal, a second electrode connected to a second voltage terminal for receiving the second low voltage, and a gate electrode connected to a first input terminal for receiving the first carry signal.

10. The gate driving circuit of claim 8, wherein the first pull down circuit comprises:

a first pull down transistor comprising a first electrode connected to the first node, a second electrode, and a gate electrode connected to a second input terminal for receiving the third carry signal;

a second pull down transistor comprising a first electrode connected to the second electrode of the first pull down transistor, a second electrode connected to a second voltage terminal for receiving the second low voltage, and a gate electrode connected to the second electrode of the first pull down transistor;

a third pull down transistor comprising a first electrode connected to a gate output terminal for outputting the gate signal, a second electrode connected to a first voltage terminal for receiving the first low voltage, and a gate electrode connected to the second node;

a fourth pull down transistor comprising a first electrode connected to the gate output terminal, a second electrode connected to the first voltage terminal, and a gate electrode connected to the second input terminal of the one of the next stages;

a fifth pull down transistor comprising a first electrode connected to a carry output terminal for outputting the second carry signal, a second electrode connected to the second voltage terminal, and a gate electrode connected to the second node;

a sixth pull down transistor comprising a first electrode connected to the carry output terminal, a second electrode connected to the second voltage terminal, and a gate electrode connected to the second input terminal; and a seventh pull down transistor comprising a first electrode connected to the second node, a second electrode connected to the second voltage terminal, and a gate electrode connected to a first input terminal.

11. The gate driving circuit of claim 8, wherein the first pull down circuit comprises:

a first pull down transistor comprising a first electrode connected to the first node, a second electrode connected to a second voltage terminal for receiving the second low voltage, and a gate electrode connected to a second input terminal for receiving the third carry signal;

a second pull down transistor comprising a first electrode connected to a gate output terminal for outputting the gate signal, a second electrode connected to a first voltage terminal, and a gate electrode connected to a second input terminal for receiving the third carry signal from the one of the next stages; and a third pull down transistor comprising a first electrode connected to a carry output terminal for outputting the second carry signal, a second electrode connected to the second voltage terminal, and a gate electrode connected to the second node.

12. The gate driving circuit of claim 8, wherein the second pull down circuit comprises a fourth pull down transistor comprising a first electrode connected to the first node, a second electrode connected to a second voltage terminal for receiving the second low voltage, and a gate electrode connected to the second node, and wherein the third pull down circuit comprises a fifth pull down transistor comprising a first electrode connected to the first node, a second electrode connected to the second voltage terminal for receiving the second low voltage, and a gate electrode connected to a third input terminal for receiving the fourth carry signal.

13. The gate driving circuit of claim 8, wherein the first carry signal is a (k-1)th carry signal from a (k-1)th stage from among the plurality of stages, wherein the third carry signal is a (k+1)th carry signal from a (k+1)th stage from among the plurality of stages, and wherein the fourth carry signal is a (k+2)th carry signal from a (k+2)th stage from among the plurality of stages.

14. A display device comprising:

a display panel comprising a plurality of pixels respectively connected to a plurality of gate lines and a plurality of data lines;

a gate driving circuit comprising a plurality of stages for outputting gate signals to the plurality of gate lines; and a data driving circuit configured to drive the plurality of data lines, wherein a k-th stage from among the plurality of stages, where k is a natural number greater than or equal to 2, comprises:

an input circuit connected to a first carry input terminal for receiving a first carry signal from one of previous stages from among the plurality of stages, and configured to pre-charge a first node;

a first output circuit configured to output a clock signal as a gate signal in response to a signal of the first node;

a second output circuit configured to output the clock signal as a second carry signal in response to the signal of the first node;

a discharge hold circuit configured to transmit the clock signal to a second node in response to the clock signal, and to discharge the second node with a second low voltage in response to the second carry signal;

a first pull down circuit configured to discharge the gate signal with a first low voltage in response to a signal of the second node and a third carry signal from one of next stages from among the plurality of stages, and to discharge the first node and the second carry signal with the second low voltage; and a discharge circuit configured to discharge the second carry signal with the second low voltage, and to discharge the second node with the second low voltage in response to the first carry signal, the discharge circuit comprising:

a first discharge transistor to discharge the second carry signal with the second low voltage in response to the first carry signal, and a second discharge transistor to discharge the second node with the second low voltage in response to the first carry signal; and a carry feedback circuit configured to feedback the second carry signal to the first carry input terminal in response to the signal of the first node.

15. The gate driving circuit of claim 1, wherein the carry feedback circuit comprises:

a first feedback transistor comprising a first electrode, a second electrode connected to the first carry input terminal, and a gate electrode connected to the first node; and a second feedback transistor comprising a first electrode connected to a second carry input terminal for receiving the second carry signal, a second electrode connected to the first electrode of the first feedback transistor, and a gate electrode connected to the second carry input terminal.

* * * * *